(12) United States Patent
Sato

(10) Patent No.: US 12,439,593 B2
(45) Date of Patent: Oct. 7, 2025

(54) SEMICONDUCTOR MEMORY DEVICE

(71) Applicant: Kioxia Corporation, Tokyo (JP)

(72) Inventor: Hiroyasu Sato, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 681 days.

(21) Appl. No.: 17/685,835

(22) Filed: Mar. 3, 2022

(65) Prior Publication Data

US 2022/0406804 A1  Dec. 22, 2022

(30) Foreign Application Priority Data

Jun. 22, 2021  (JP) .................... 2021-103042

(51) Int. Cl.
*H10B 41/27* (2023.01)
*H10B 41/20* (2023.01)
*H10B 43/20* (2023.01)
*H10B 43/27* (2023.01)
*H10B 41/00* (2023.01)
*H10B 43/00* (2023.01)

(52) U.S. Cl.
CPC ............. *H10B 41/27* (2023.02); *H10B 41/20* (2023.02); *H10B 43/20* (2023.02); *H10B 43/27* (2023.02); *H10B 41/00* (2023.02); *H10B 43/00* (2023.02)

(58) Field of Classification Search
CPC ........ H10B 41/00; H10B 41/20; H10B 41/23; H10B 41/27; H10B 43/00; H10B 43/20; H10B 43/23; H10B 43/27
See application file for complete search history.

(56) References Cited

U.S. PATENT DOCUMENTS

2014/0048868 A1*  2/2014  Kim ................. H01L 29/66833
                                                        257/324
2014/0322832 A1*  10/2014  Kim ...................... H01L 22/12
                                                        438/14

(Continued)

FOREIGN PATENT DOCUMENTS

| JP | 2015-176309 A | 10/2015 |
| TW | I671878 B | 9/2019 |
| TW | 202121659 A | 6/2021 |

OTHER PUBLICATIONS

Berberich et al, Trench Sidewall Doping for Lateral Power Devices, Oct. 2003, IEEE, ESDERC '03 33rd Conference, p. 2 (Year: 2003).*

(Continued)

*Primary Examiner* — Chad M Dicke
*Assistant Examiner* — Prashant Kenkare
(74) *Attorney, Agent, or Firm* — Foley & Lardner LLP

(57) ABSTRACT

A semiconductor memory device includes a substrate, a plurality of first conductive layers and a plurality of first insulating layers alternately arranged in a first direction intersecting the substrate, a first semiconductor layer extending in the first direction and facing the first semiconductor layers and the first insulating layers, a first charge storage layer disposed between the first conductive layers and the first semiconductor layer, and a second semiconductor layer connected to one end of the first semiconductor layer in the first direction. The first insulating layers at least partially contains a first element. The first element is at least one of phosphorus (P), arsenic (As), carbon (C), and argon (Ar).

12 Claims, 38 Drawing Sheets

(56) References Cited

U.S. PATENT DOCUMENTS

| | | |
|---|---|---|
| 2015/0262630 A1 | 9/2015 | Shirakawa et al. |
| 2015/0372005 A1* | 12/2015 | Yon .................. H10B 41/27 |
| | | 257/314 |
| 2017/0092654 A1* | 3/2017 | Nishikawa ............ H10D 62/83 |
| 2017/0243883 A1* | 8/2017 | Kobayashi ........... H10D 62/378 |
| 2018/0076085 A1* | 3/2018 | Hazue .................. H10B 43/10 |
| 2019/0043569 A1* | 2/2019 | Chen ................. H01L 21/02271 |
| 2019/0304979 A1 | 10/2019 | Ahn |
| 2020/0185405 A1 | 6/2020 | Cui et al. |
| 2020/0194441 A1* | 6/2020 | Kwon .................. H10B 43/27 |
| 2020/0295036 A1* | 9/2020 | Sotome ................ H01L 23/481 |
| 2021/0035998 A1* | 2/2021 | Nishikawa ............ H10B 41/35 |
| 2021/0036012 A1* | 2/2021 | Kim .................... H10D 64/037 |
| 2021/0057432 A1 | 2/2021 | Lu et al. |
| 2021/0111184 A1 | 4/2021 | Smith et al. |
| 2021/0217768 A1* | 7/2021 | Fukuzumi ........... H10D 64/685 |
| 2021/0249428 A1* | 8/2021 | Guo .................... H10B 53/20 |
| 2021/0320123 A1* | 10/2021 | Lee .................... H10B 43/40 |

OTHER PUBLICATIONS

Qin et al, Doping Process for 3-D N-Type Trench Transistors-2-D Cross-Sectional Doping Profiling Study, Jul. 2013, IEEE Transactions on Electron Devices, vol. 60, No. 7, p. 2256 (Year: 2013).*

Deal et al., "Thermal Oxidation of Heavily Doped Silicon" Research & Development Laboratory, Fairchild Semiconductor, Pale Alto, California, Journal of the Electrochemical Society, Apr. 1965, vol. 112, No. 4, pp. 430-435.

Ku, et al., "Effects of germanium and carbon coimplants on phosphorus diffusion in silicon" Applied Physics Letters 89, 112104 (2006), URL: https://doi.org/10.1063/1.2347896, Sep. 11, 2006.

Wirbeleit, "Non-Gaussian Diffusion Model for Phosphorus in Silicon Heavy-Doped Junctions" Globalfoundries, 2070 Route 52, Hopewell Junction, NY 12533, U.S.A., Diffusion Fundamentals 9 (2009) 5.1-5.7, 2009.

* cited by examiner

SEMICONDUCTOR MEMORY DEVICE

CROSS-REFERENCE TO RELATED APPLICATION(S)

This application is based upon and claims the benefit of priority from Japanese Patent Application No. 2021-103042, filed Jun. 22, 2021, the entire contents of which are incorporated herein by reference.

FIELD

Embodiments described herein relate generally to a semiconductor memory device.

BACKGROUND

A semiconductor memory device including a plurality of first conductive layers and a plurality of first insulating layers alternately arranged in a first direction, a first semiconductor layer extending in the first direction and facing the first conductive layers and the first insulating layers, and a first charge storage layer disposed between the first conductive layers and the first semiconductor layer has been known.

DETAILED DESCRIPTION

Figure 1:
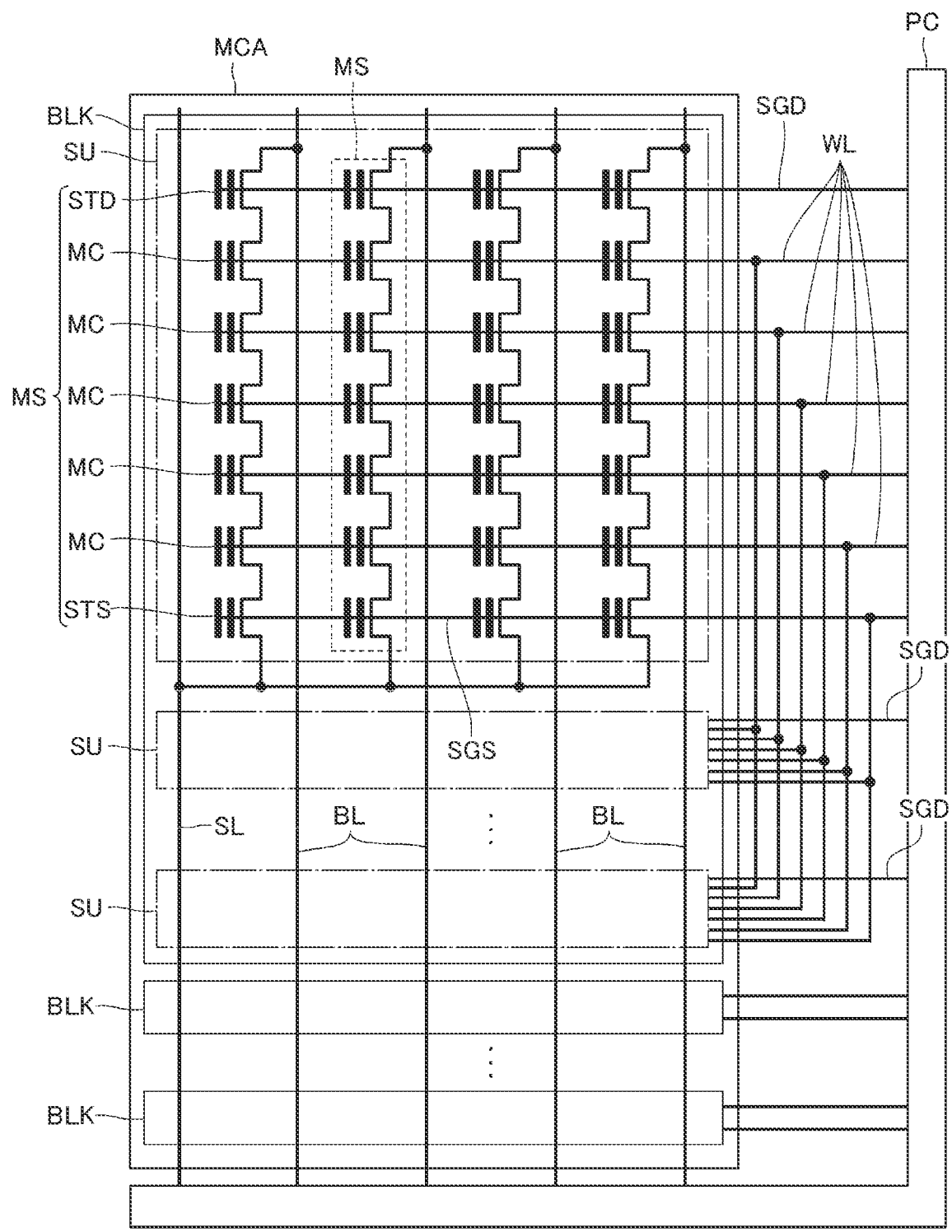
FIG. 1 is a schematic circuit diagram illustrating a configuration of a part of a semiconductor memory device according to a first embodiment.

Embodiments provide a semiconductor memory device capable of suitably being produced.

In general, according to at least one embodiment, a semiconductor memory device includes a substrate, a plurality of first conductive layers and a plurality of first insulating layers alternately arranged in a first direction intersecting the substrate, a first semiconductor layer extending in the first direction and facing the first conductive layers and the first insulating layers, a first charge storage layer disposed between the first conductive layers and the first semiconductor layer, and a second semiconductor layer connected to one end in the first direction of the first semiconductor layer, the first insulating layers at least partially contain a first element, and the first element is at least one of phosphorus (P), arsenic (As), carbon (C), and argon (Ar).

Next, semiconductor memory devices according to embodiments will be described in detail with reference to the drawings. The following embodiments are merely an example, and are not intended to be limited to the present disclosure. The following drawings are schematic, and for convenience of description, a part of a configuration and the like may be omitted. A portion common to a plurality of embodiments is denoted by the same reference symbol, and description thereof may be omitted.

A "semiconductor memory device" discussed herein may mean a memory die, or a memory system including a controller die, such as a memory chip, a memory card, and a solid state drive (SSD). In addition, the semiconductor memory device may mean a configuration including a host computer, such as a smartphone, a tablet terminal, and a personal computer.

A first configuration being "connected between" a second configuration and a third configuration, discussed herein may mean that the first, second, and third configurations are connected to one another in series, and the second configuration is connected to the third configuration via the first configuration.

Herein, a predetermined direction parallel to the upper surface of a substrate is called an X direction, a direction that is parallel to the upper surface of the substrate and is perpendicular to the X direction is called a Y direction, and a direction perpendicular to the upper surface of the substrate is called a Z direction.

Herein, a direction along a predetermined surface may be called a first direction, a direction intersecting the first direction along the predetermined surface may be called a second direction, and a direction intersecting the predetermined surface may be called a third direction. The first, second, and third directions may or may not correspond to any of the X, Y, and Z directions.

Herein, the expressions "upper", "lower", and the like are based on the substrate. For example, a direction far from the substrate in the Z direction is called upper, and a direction toward the substrate in the Z direction is called lower. The lower surface and the lower end of a certain configuration mean a surface and an end on a substrate side of this configuration, respectively. The upper surface and the upper end of the configuration mean a surface and an end on a side opposite to the substrate of the configuration, respectively. A surface intersecting the X or Y direction is called a side face and the like.

The "width", "length", "thickness", or the like in a predetermined direction of a configuration, a member, or the like, discussed herein may mean the width, length, thickness, or the like in a cross section or the like that is observed by scanning electron microscopy (SEM), transmission electron microscopy (TEM), or the like.

First Embodiment

FIG. 1 is a schematic circuit diagram illustrating a configuration of a part of a semiconductor memory device according to a first embodiment. The semiconductor memory device according to the first embodiment includes a memory cell array MCA and a peripheral circuit PC.

The memory cell array MCA includes a plurality of memory blocks BLK. Each of the memory blocks BLK includes a plurality of string units SU. Each of the string units SU includes a plurality of memory strings MS. One end of each of the memory strings MS is connected to the peripheral circuit PC via each of bit lines BL. Another end of each of the memory strings MS is connected to the peripheral circuit PC via a common source line SL.

The memory strings MS each include a drain-side select transistor STD, a plurality of memory cells MC (memory transistors), and a source-side select transistor STS. The drain-side select transistor STD, the memory cells MC, and the source-side select transistor STS are connected to one another in series between the bit lines BL and the source line SL. Hereinafter, the drain-side select transistor STD and the source-side select transistor STS are simply sometimes called select transistors (STD and STS).

The memory cells MC are an electric field effect-type transistor. The memory cells MC each include a semiconductor layer, a gate insulating film, and a gate electrode. The semiconductor layer functions as a channel region. The gate insulating film includes a charge storage film. The threshold voltage of each of the memory cells MC varies depending on the amount of charge in the charge storage film. The memory cells MC each store data of 1 bit or a plurality of bits. To each of the gate electrodes of the memory cells MC corresponding to one of the memory strings MS, each of word lines WL is connected. The word lines WL are connected commonly to all the memory strings MS in one of the memory blocks BLK.

The select transistors (STD and STS) are an electric field effect-type transistor. The select transistors (STD and STS) each include a semiconductor layer, a gate insulating film, and a gate electrode. The semiconductor layer functions as a channel region. To the gate electrodes of the select transistors (STD and STS), select gate lines (SGD and SGS) are each connected. One drain-side select gate line SGD is connected commonly to all the memory strings MS in one of the string units SU. One source-side select gate line SGS is connected commonly to all the memory strings MS in one of the memory blocks BLK.

For example, the peripheral circuit PC includes a voltage producing circuit for producing an operating voltage, a voltage transferring circuit for transferring the produced operating voltage to selected bit line BL, word line WL, source line SL, select gate lines (SGD and SGS), and the like, a sense amplifier module connected to the bit line BL, and a sequencer for controlling them.

Figure 2:
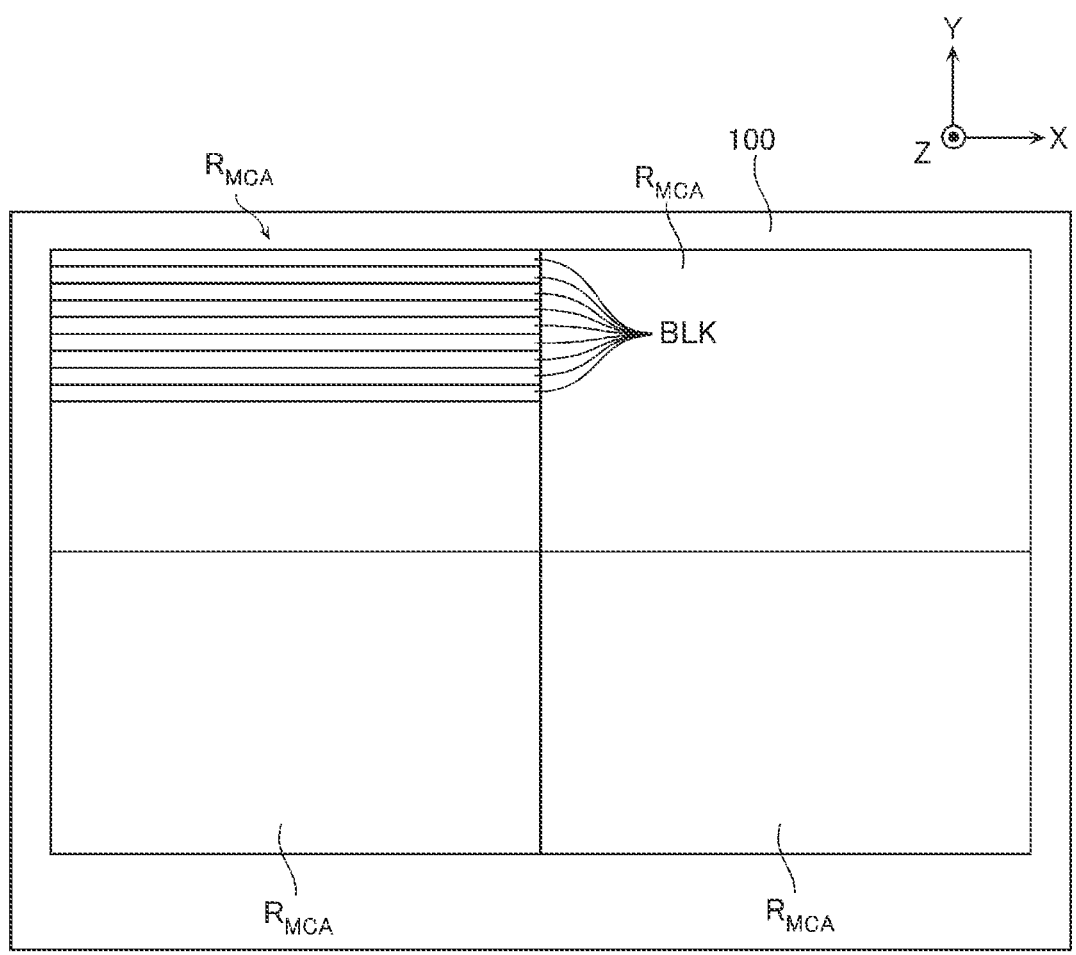
FIG. 2 is a schematic plan view illustrating a configuration of a part of the semiconductor memory device.

FIG. 2 is a schematic plan view illustrating a configuration of a part of the semiconductor memory device according to the first embodiment. The semiconductor memory device according to at least one embodiment includes a semiconductor substrate 100. For example, the semiconductor substrate 100 is a semiconductor substrate made from a P-type silicon (Si) containing a P-type impurity such as boron (B). In an example of the drawing, four memory cell array regions $R_{MCA}$ arranged in the X and Y directions are disposed on the semiconductor substrate 100. On each of the memory cell array regions $R_{MCA}$, a plurality of the memory blocks BLK arranged in the Y direction are provided.

Figure 3:
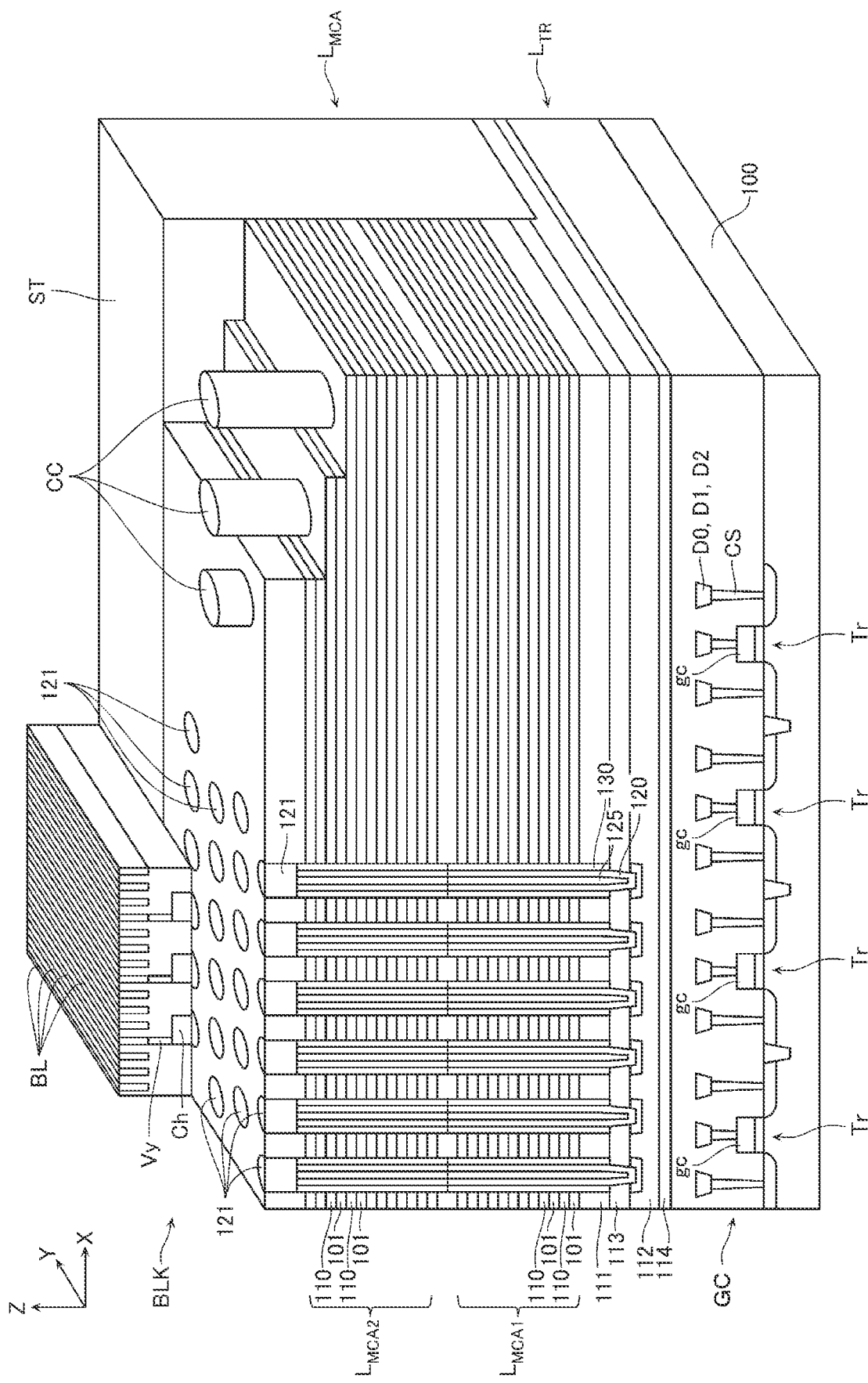
FIG. 3 is a schematic perspective view illustrating a configuration of a part of the semiconductor memory device.
Figure 4:
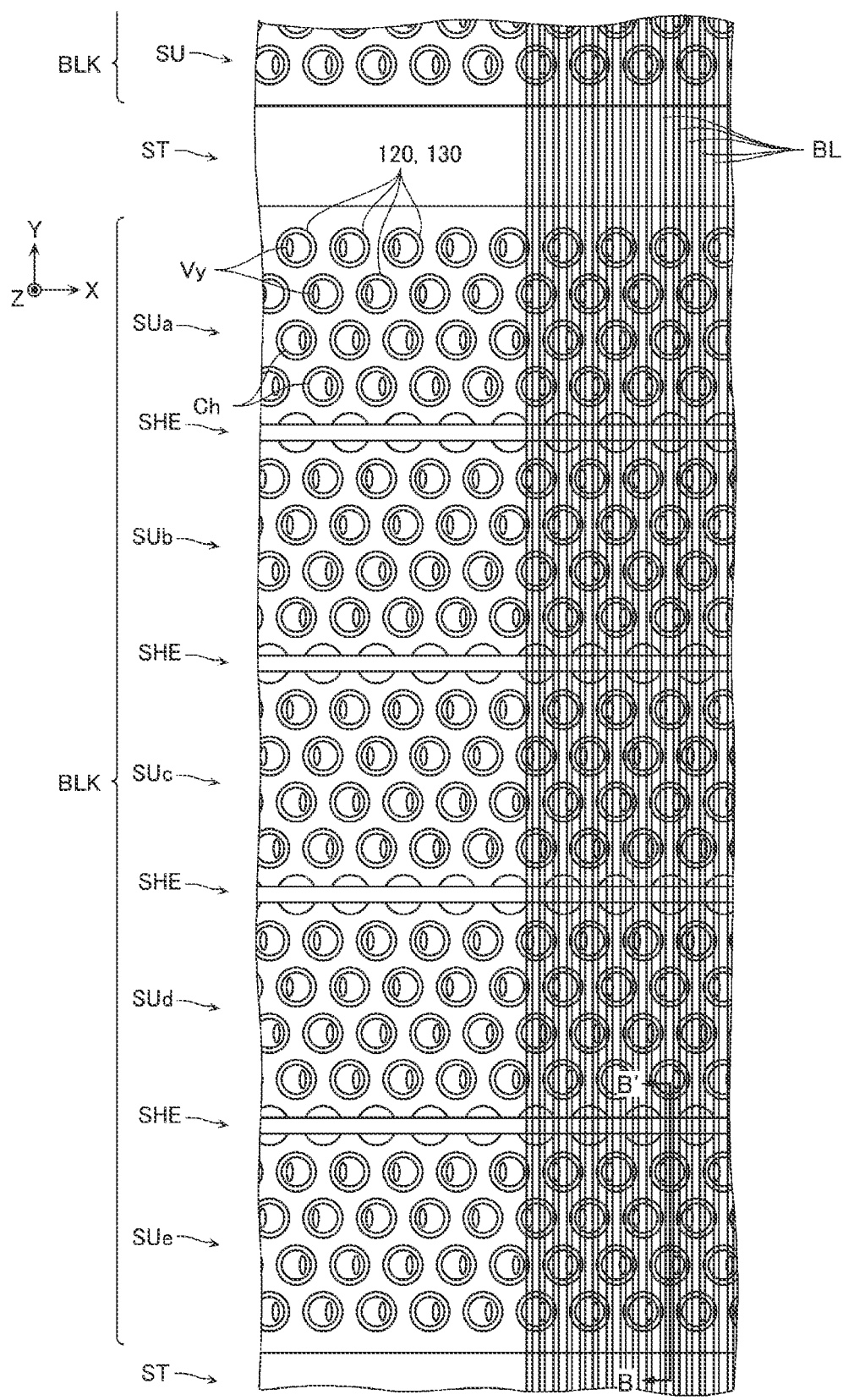
FIG. 4 is a schematic plan view illustrating a configuration of a part of the semiconductor memory device.
Figure 5:
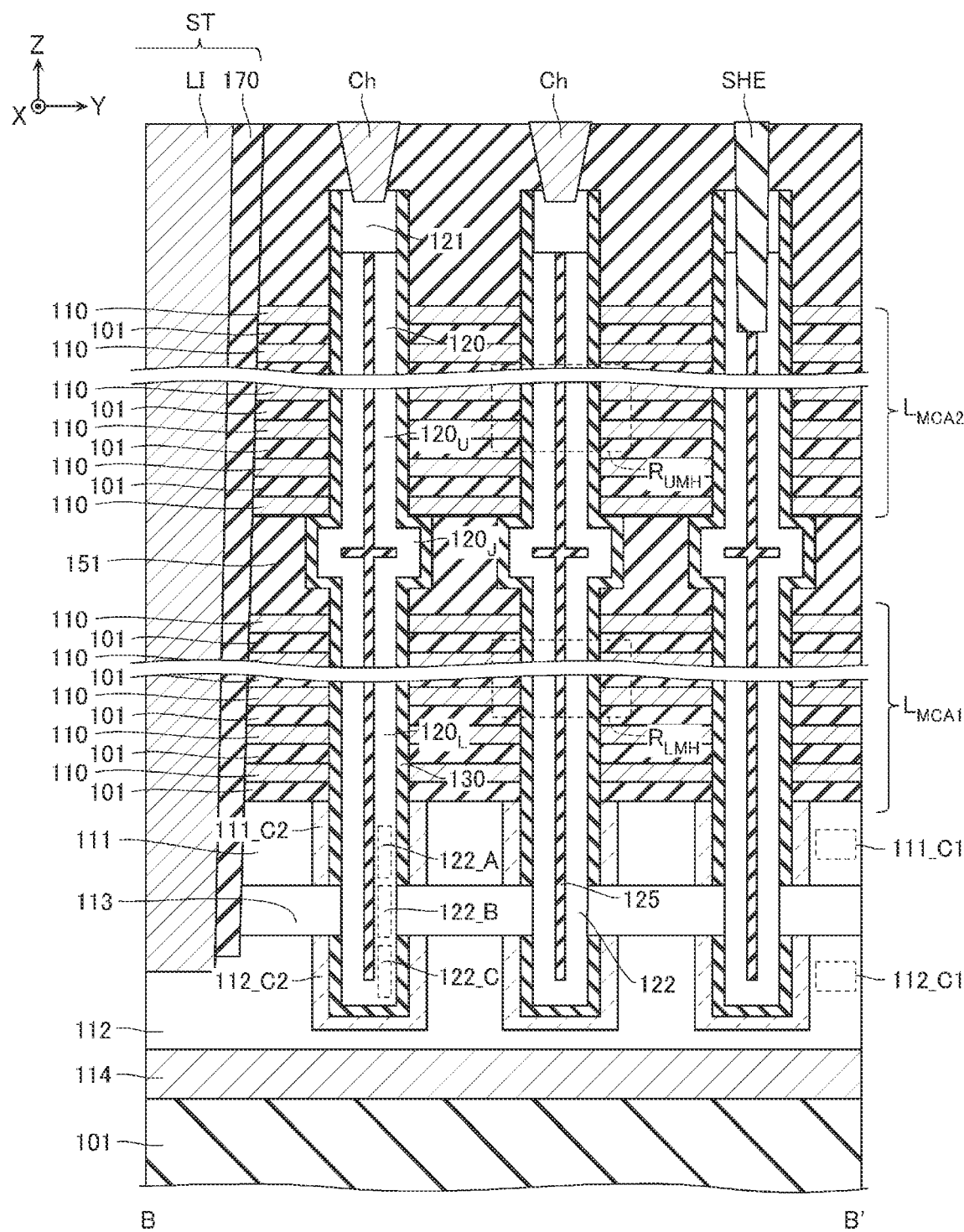
FIG. 5 is a schematic cross-sectional view illustrating a configuration of a part of the semiconductor memory device.

FIG. 3 is a schematic perspective view illustrating a configuration of a part of the semiconductor memory device according to the first embodiment. FIG. 4 is a schematic plan view illustrating a configuration of a part of the semiconductor memory device according to the first embodiment. FIG. 5 is a schematic cross-sectional view obtained by cutting a structure illustrated in FIG. 4 along a line B-B', and viewed in a direction of an arrow.

As illustrated in FIG. 3, for example, the semiconductor memory device according to at least one embodiment includes a transistor layer $L_{TR}$ disposed on the semiconductor substrate 100, and a memory cell array layer $L_{MCA}$ disposed above the transistor layer $L_{TR}$.

Structure of Transistor Layer $L_{TR}$

As illustrated in FIG. 3, for example, a wiring layer GC is disposed on an upper surface of the semiconductor substrate 100 via an insulating layer not shown. The wiring layer GC contains a plurality of electrodes gc that face the surface of the semiconductor substrate 100. The electrodes gc contained in each region of the semiconductor substrate 100 and the wiring layer GC are each connected to a contact CS.

The electrodes gc each face the surface of the semiconductor substrate 100. The electrodes gc function as gate electrodes of a plurality of transistors Tr, other electrodes of a plurality of capacitors, and the like that consist the peripheral circuit PC.

A plurality of the contacts CS extend in the Z direction, and the lower ends of the contacts CS are connected to the upper surface of the semiconductor substrate 100 or the upper surfaces of the electrodes gc. At each connection portion between the contacts CS and the semiconductor substrate 100, an impurity region containing an N-type impurity or a P-type impurity is disposed. For example, the contacts CS may include a stacked film containing a barrier conductive film made of titanium nitride (TiN) and the like, and a metal film made of tungsten (W) and the like.

Wiring layers D0, D1, and D2 each contain a plurality of wirings, and the wirings are electrically connected to at least one of a configuration in the memory cell array MCA and a configuration in the peripheral circuit PC. For example, the wirings may contain a stacked film containing a barrier conductive film made of titanium nitride (TiN) and the like, and a metal film made of tungsten (W) and the like.

Structure of Memory Cell Array Layer $L_{MCA}$

As illustrated in FIGS. 3 and 4, for example, the plurality of memory blocks BLK arranged in the Y direction are disposed in the memory cell array $L_{MCA}$.

In an example of FIG. 4, each of the memory blocks BLK includes five string units SUa to SUe that are disposed from one side of the Y direction (a positive side of the Y direction in FIG. 4) to another side of the Y direction (a negative side of the Y direction in FIG. 4). The string units SUa to SUe each correspond to the string units SU described with reference to FIG. 1. Between two of the string units SU that are adjacent in the Y direction, an inter-string unit insulating layer SHE made of silicon oxide (SiO$_2$) and the like is disposed. Between two of the memory blocks BLK that are adjacent in the Y direction, an inter-block structure ST is disposed.

As illustrated in FIGS. 3 and 5, the memory blocks BLK in the memory cell array layer $L_{MCA}$ include a memory cell array layer $L_{MCA1}$ and a memory cell array layer $L_{MCA2}$ disposed above the memory cell array layer $L_{MCA1}$. The memory cell array layers $L_{MCA1}$ and $L_{MCA2}$ include a plurality of conductive layers 110 arranged in the Z direction, a plurality of semiconductor layers 120 extending in the Z direction, and a plurality of gate insulating films 130 each disposed between the conductive layers 110 and the semiconductor layers 120.

The conductive layers 110 are a substantially plate-shaped conductive layer extending in the X direction. The conductive layers 110 may contain a stacked film containing a barrier conductive film made of titanium nitride (TiN) and the like, and a metal film made of tungsten (W) and the like. For example, the conductive layers 110 may contain polycrystalline silicon containing an impurity such as phosphorus (P) or boron (B), and the like. At each of ends in the X direction of the conductive layers 110, a contact CC (FIG. 3) is disposed. Between the conductive layers 110 arranged in the Z direction, each insulating layer 101 made of silicon oxide (SiO$_2$) and the like is disposed.

Semiconductor layers 111, 113, and 112 are disposed via the insulating layers 101 below the conductive layers 110. Between the semiconductor layers 111 and 112 and the respective semiconductor layers 120, a part of the respective gate insulating films 130 is disposed. The semiconductor layer 113 is connected to lower end portions of the semiconductor layers 120.

The upper surface of the semiconductor layer 113 is connected to the semiconductor layer 111, and the lower surface of the semiconductor layer 113 is connected to the semiconductor layer 112. On the lower surface of the semiconductor layer 112, a conductive layer 114 may be disposed. The semiconductor layers 111, 113, and 112, and the conductive layer 114 function as the source line SL (FIG. 1). For example, the source line SL is provided commonly to all the memory blocks BLK contained in the memory cell array regions $R_{MCA}$ (FIG. 2). For example, the semiconductor layers 111, 113, and 112 contain polycrystalline silicon containing an impurity such as phosphorus (P) or boron (B), and the like. For example, the conductive layer 114 may contain a conductive layer made of a metal such as tungsten (W), tungsten silicide, and the like, or another conductive layer.

Among the conductive layers 110, the conductive layer 110 that is the lowest layer functions as the source-side select gate line SGS (FIG. 1) and the gate electrodes of a plurality of the source-side select transistors STS (FIG. 1) connected to the source-side select gate line SGS. This conductive layer 110 is electrically independent of each of the memory blocks BLK.

A plurality of the conductive layers 110 that are above this conductive layer 110 that is the lowest layer function as the word line WL (FIG. 1) and the gate electrodes of a plurality of the memory cells MC (FIG. 1) connected to the word line WL. The conductive layers 110 are each electrically independent of each of the memory blocks BLK.

One or more of the conductive layers 110 that are above this conductive layer 110 function as the drain-side select gate line SGD (FIG. 1) and the gate electrodes of a plurality of the drain-side select transistors STD (FIG. 1) connected to the drain-side select gate line SGD. The widths in the Y direction of the conductive layers 110 are smaller than those of the other conductive layers 110. Between two of the conductive layers 110 that are adjacent in the Y direction, the inter-string unit insulating layer SHE is disposed. The conductive layers 110 are each electrically independent of each of the string units SU.

As illustrated in FIGS. 3 and 4, for example, the semiconductor layers 120 are arranged in a predetermined pattern in the X and Y directions. The semiconductor layers 120 function as channel regions of a plurality of the memory cells MC and the select transistors (STD and STS) contained in one of the memory strings MS (FIG. 1). For example, the semiconductor layers 120 are a semiconductor layer made of polycrystalline silicon (Si) and the like. As illustrated in FIG. 3, for example, the semiconductor layers 120 have a substantially cylindrical shape with a bottom, and at a central portion of each of the semiconductor layers 120, an insulating layer 125 made of silicon oxide and the like is disposed.

As illustrated in FIG. 5, each of the semiconductor layers 120 includes a semiconductor region $120_L$, contained in the memory cell array layer $L_{MCA1}$ and a semiconductor region $120_U$ contained in the memory cell array layer $L_{MCA2}$. Each of the semiconductor layers 120 includes a semiconductor region $120_J$ connected to the upper end of the semiconductor region $120_L$, and the lower end of the semiconductor region $120_U$, an impurity region 122 connected to the lower end of the semiconductor region $120_L$, and an impurity region 121 connected to the upper end of the semiconductor region $120_U$.

Each of the semiconductor regions $120_L$ is a substantially cylindrical region extending in the Z direction. The outer circumferential surface of each of the semiconductor regions $120_L$, is surrounded by the conductive layers 110 contained in the memory cell array layer $L_{MCA1}$, and faces the conductive layers 110. The width in the radial direction of a lower end portion (for example, a portion positioned below the conductive layers 110 contained in the memory cell array layer $L_{MCA1}$) of each of the semiconductor regions $120_L$ is smaller than the width in the radial direction of an upper end portion (for example, a portion positioned above the conductive layers 110 contained in the memory cell array layer $L_{MCA1}$) of each of the semiconductor regions $120_L$.

Each of the semiconductor regions $120_U$ is a substantially cylindrical region extending in the Z direction. The outer circumferential surface of each of the semiconductor regions $120_U$ is surrounded by the conductive layers 110 contained in the memory cell array layer $L_{MCA2}$, and faces the conductive layers 110. The width in the radial direction of a lower end portion (for example, a portion positioned below the conductive layers 110 contained in the memory cell array layer $L_{MCA2}$) of each of the semiconductor regions $120_U$ is smaller than the width in the radial direction of an upper end portion (for example, a portion positioned above the conductive layers 110 contained in the memory cell array layer $L_{MCA2}$) of each of the semiconductor regions $120_U$.

Each of the semiconductor regions $120_J$ is disposed above the conductive layers 110 contained in the memory cell array layer $L_{MCA1}$ and is disposed below the conductive layers 110 contained in the memory cell array layer $L_{MCA2}$. The width in the radial direction of each of the semiconductor regions $120_J$ is larger than the width in the radial direction of each of the semiconductor regions $120_L$ and $120_U$.

Each of the impurity regions 122 includes a region 122_A facing the semiconductor layer 111, a region 122_C facing the semiconductor layer 112, and a region 122_B disposed between the regions 122_A and 122_C and having an outer circumferential surface that is connected to the semiconductor layer 113. That is, each of the regions 122_C is disposed at the lower end of each of the semiconductor layers 120. The regions 122_B are each disposed between the semiconductor regions $120_L$, and the regions 122_C. For example, the impurity regions 122 may contain an N-type impurity such as phosphorus (P) or a P-type impurity such as boron (B).

For example, the impurity regions 121 contain an N-type impurity such as phosphorus (P). Each of the impurity regions 121 is connected to each of the bit lines BL via each contact Ch and each contact Vy (FIG. 3).

The gate insulating films 130 have a substantially cylindrical shape with a bottom that covers the outer circumferential surface of each of the semiconductor layers 120. For example, the gate insulating films 130 each includes a tunnel insulating film, a charge storage film, and a block insulating film that are stacked between each of the semiconductor layers 120 and each of the conductive layers 110. For example, the tunnel insulating film and the block insulating film are an insulating film made of silicon oxide ($SiO_2$) and the like. For example, the charge storage film is a film that is made of a silicon nitride ($Si_3N_4$) and the like and is capable of storing a charge. The tunnel insulating film, the charge storage film, and the block insulating film have a substantially cylindrical shape, and extend in the Z direction along the outer circumferential surface of each of the semiconductor layers 120.

For example, the gate insulating films 130 may include a floating gate made of polycrystalline silicon containing an N-type or P-type impurity, and the like.

The inter-block structure ST is a structure that extends in the Z and X directions, divides the insulating layers 101, the conductive layers 110, and the semiconductor layers 111 and 113 in the Y direction, and reaches the semiconductor layer 112. For example, the inter-block structure ST may include an insulating layer 170 made of silicon oxide ($SiO_2$) and the like, and a conductive layer LI made of tungsten and the like. The lower end of the conductive layer LI is connected to the semiconductor layer 112.

Impurity contained in Each Configuration in Memory Cell Array Layer $L_{MCA}$

Figure 6:
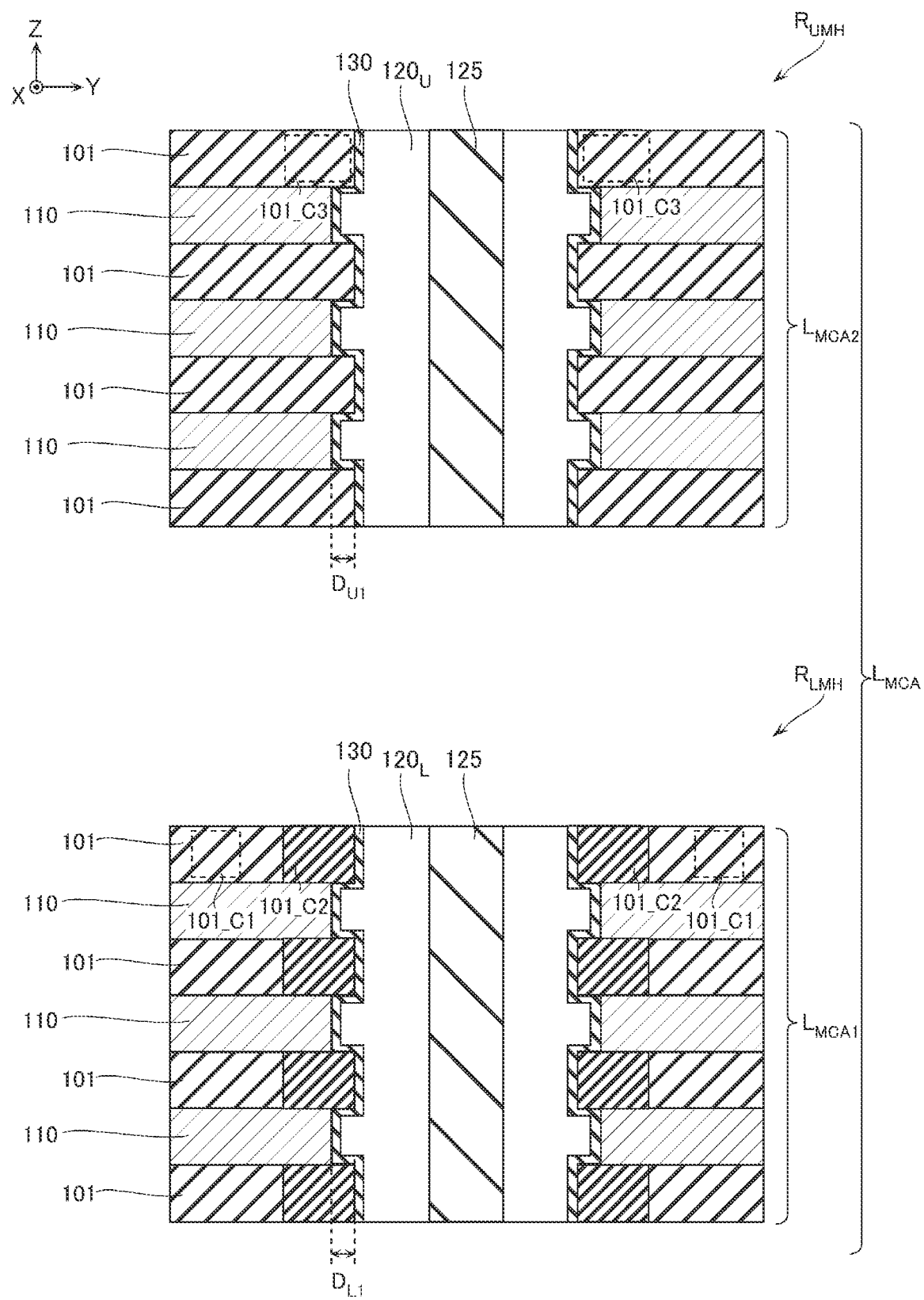
FIG. 6 is a schematic cross-sectional view illustrating a configuration of a part of the semiconductor memory device.

FIG. 6 is a schematic cross-sectional view illustrating a region $R_{LMH}$ in the memory cell array layer $L_{MCA1}$ and a region $R_{UMH}$ in the memory cell array layer $L_{MCA2}$, illustrated in FIG. 5, on an enlarged scale.

As illustrated in FIG. 6, in the memory cell array layer $L_{MCA1}$, surfaces of the conductive layers 110 that face the semiconductor region $120_L$ are disposed behind surfaces of the insulating layers 101 that face the semiconductor region $120_L$ by a width $D_{L1}$. In the memory cell array layer $L_{MCA2}$, surfaces of the conductive layers 110 that face the semiconductor region $120_U$ are disposed behind surfaces of the insulating layers 101 that face the semiconductor region $120_U$ by a width $D_{U1}$. The width $D_{L1}$ is substantially the same as the width $D_{U1}$.

In the memory cell array layer $L_{MCA1}$, the insulating layers 101 each contain regions 101_C1 and 101_C2. The region 101_C2 is disposed between the region 101_C1 and the semiconductor region $120_L$. That is, the region 101_C2 is disposed at a position closer to the semiconductor region $120_L$ than the region 101_C1. The region 101_C2 is a region containing at least one element of phosphorus (P), arsenic (As), carbon (C), and argon (Ar). The concentration of the element contained in the region 101_C2 is larger than the concentration of the element contained in the region 101_C1.

In the memory cell array layer $L_{MCA2}$, the insulating layers 101 each contain a region 101_C3. The region 101_C3 is disposed at a position aligned with the region 101_C2 in the Z direction. The concentration of at least one element of phosphorus (P), arsenic (As), carbon (C), and argon (Ar) contained in the region 101_C3 is smaller than the concentration of the element contained in the region 101_C2.

As illustrated in FIG. 5, for example, the semiconductor layer 111 contains regions 111_C1 and 111_C2. The region 111_C2 is disposed between the region 111_C1 and each of the impurity regions 122. That is, the region 111_C2 is disposed at a position closer to the impurity regions 122 than the region 111_C1. The region 111_C2 is a region containing at least one element of phosphorus (P), arsenic (As), carbon (C), and argon (Ar). The concentration of the element contained in the region 111_C2 is larger than the concentration of the element contained in the region 111_C1.

As illustrated in FIG. 5, for example, the semiconductor layer 112 contains regions 112_C1 and 112_C2. The region 112_C2 is disposed between the region 112_C1 and each of the impurity regions 122. That is, the region 112_C2 is disposed at a position closer to the impurity regions 122 than the region 112_C1. The region 112_C2 is a region containing at least one element of phosphorus (P), arsenic (As), carbon (C), and argon (Ar). The concentration of the element contained in the region 112_C2 is larger than the concentration of the element contained in the region 112_C1.

The concentrations of phosphorus (P), arsenic (As), carbon (C), argon (Ar), and the like contained in each region can be measured by an energy dispersive X-ray spectrometer (EDS) and the like.

Production Method

With reference to FIGS. 7 to 29, a method for producing the semiconductor memory device according to the first embodiment will be described. FIGS. 7 to 9, 11, 13 to 18, and 20 to 29 are schematic cross-sectional views illustrating this method, and illustrate a cross section corresponding to FIG. 5. FIGS. 10 and 12 are schematic cross-sectional views illustrating this method. FIGS. 10 and 12 are views of the regions $R_{LMH}$ and $R_{SL}$ illustrated in FIGS. 9 and 11, respectively, on an enlarged scale. FIG. 19 is a schematic cross-sectional view illustrating this method, and is a view of the regions $R_{UMH}$ and $R_{LMH}$ illustrated in FIG. 18 on an enlarged scale.

In production of the semiconductor memory device according to the first embodiment, the peripheral circuit PC (FIG. 1) is formed on the semiconductor substrate 100. Above the peripheral circuit PC, the insulating layer 101 is formed.

Figure 7:
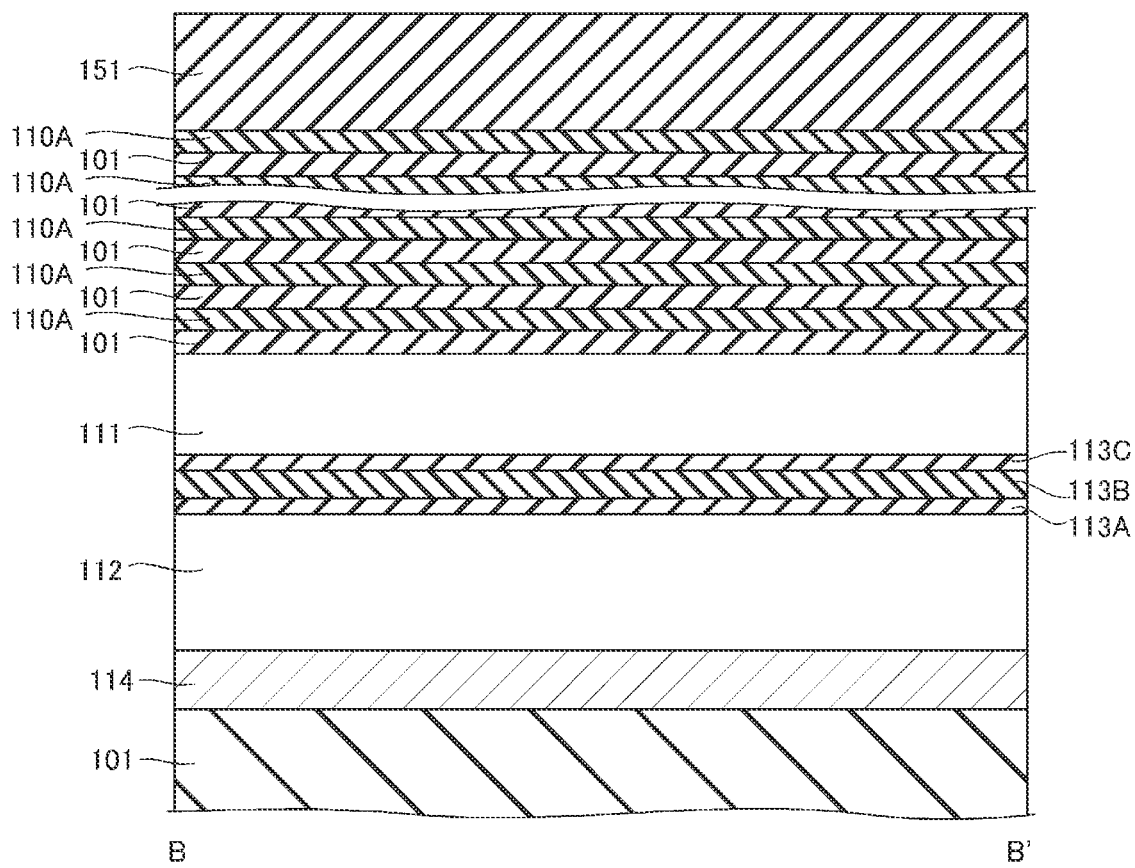
FIG. 7 is a schematic cross-sectional view illustrating a method for producing the semiconductor memory device.

As illustrated in FIG. 7, for example, the conductive layer 114, the semiconductor layer 112, and a sacrificial layer 113A made of silicon oxide and the like, a sacrificial layer 113B made of silicon nitride and the like, a sacrificial layer 113C made of silicon oxide and the like, and the semiconductor layer 111 are formed on the insulating layer 101. A plurality of the insulating layers 101 and a plurality of sacrificial layers 110A are alternately formed, and an insulating layer 151 made of silicon oxide and the like is formed. For example, this process is performed by a method such as chemical vapor deposition (CVD).

Figure 8:
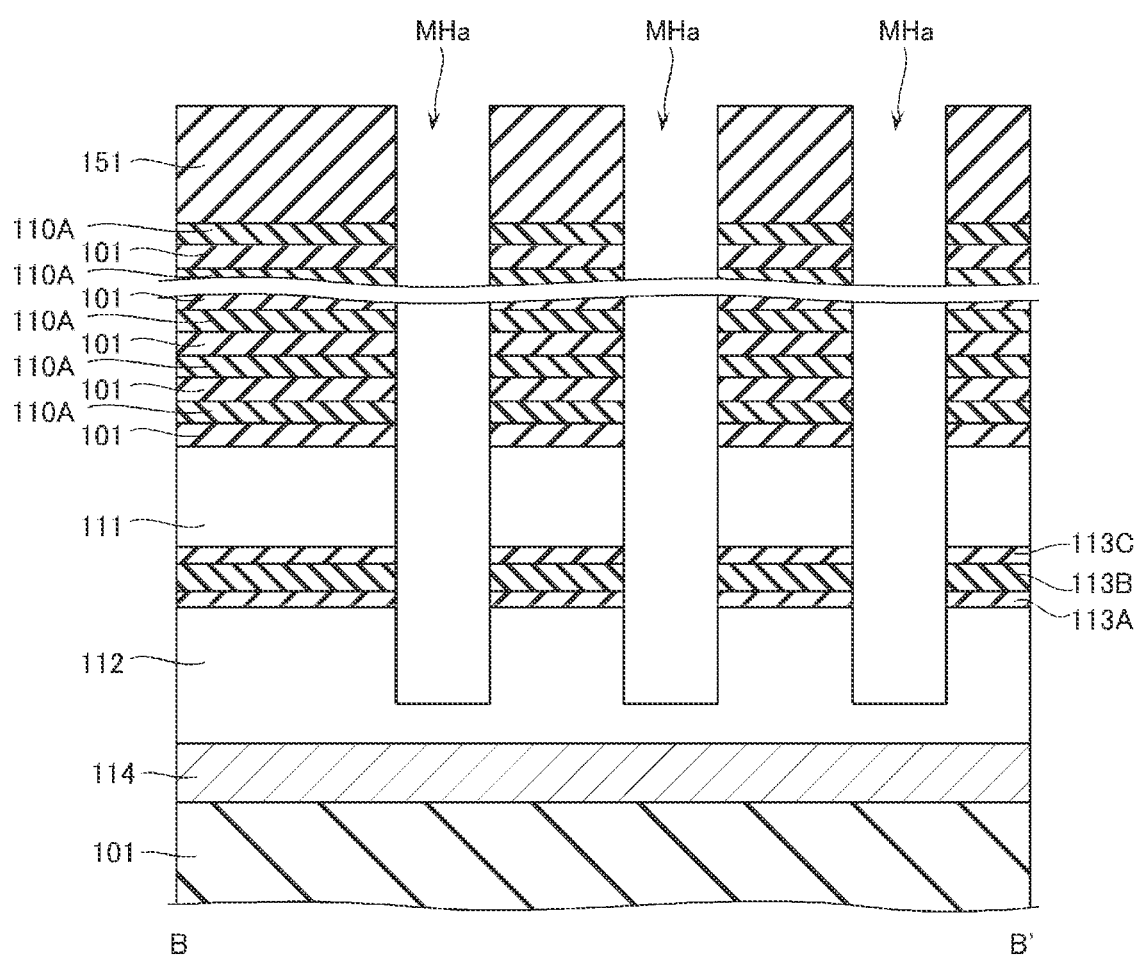
FIG. 8 is a schematic cross-sectional view illustrating the method for producing the semiconductor memory device.

As illustrated in FIG. 8, for example, a plurality of openings MHa are formed at positions corresponding to the semiconductor regions $120_L$. The openings MHa extend in the Z direction, and penetrate the insulating layer 151, the sacrificial layers 110A and the insulating layers 101, the semiconductor layer 111, and the sacrificial layers 113C, 113B, and 113A, and the semiconductor layer 112 is exposed to the openings MHa. For example, this process is performed by a method such as RIE.

Figure 9:
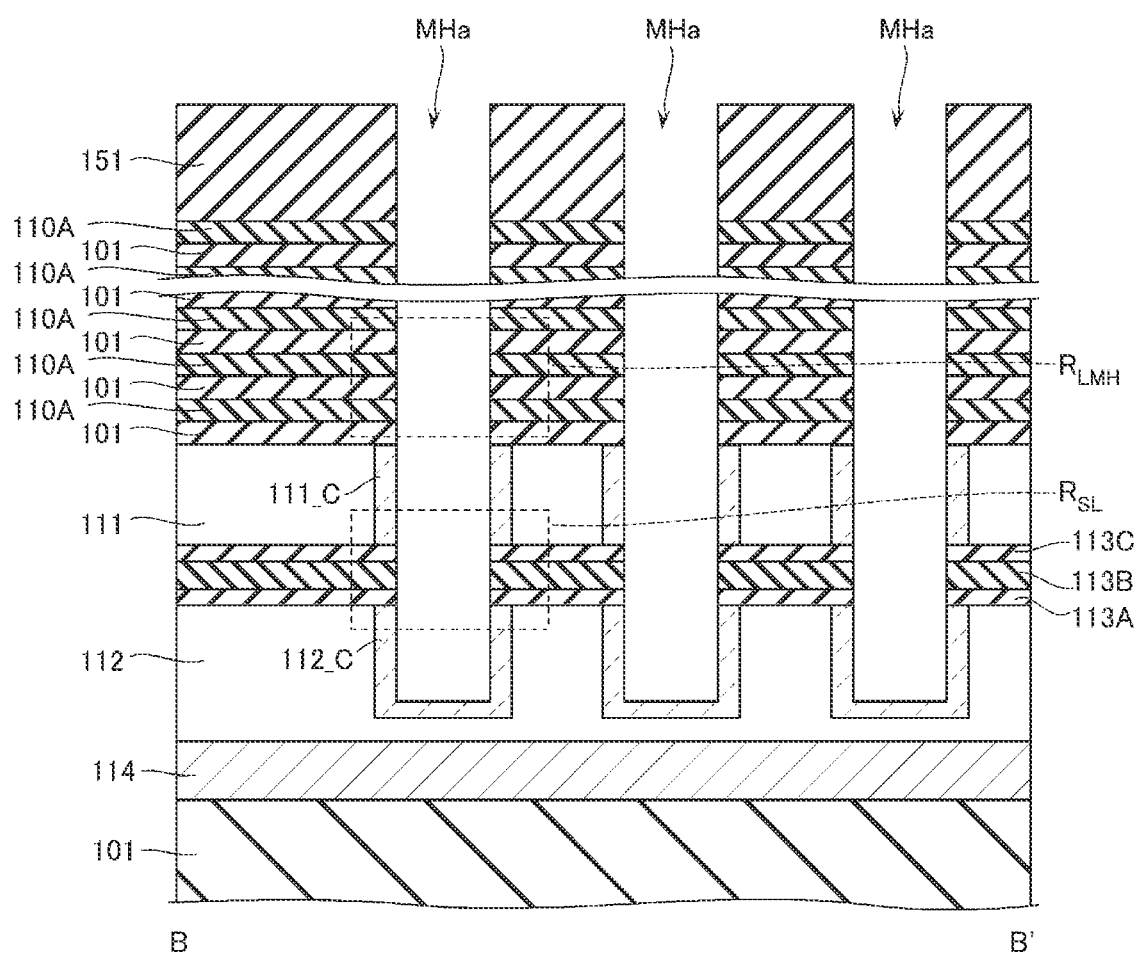
FIG. 9 is a schematic cross-sectional view illustrating the method for producing the semiconductor memory device.
Figure 10:
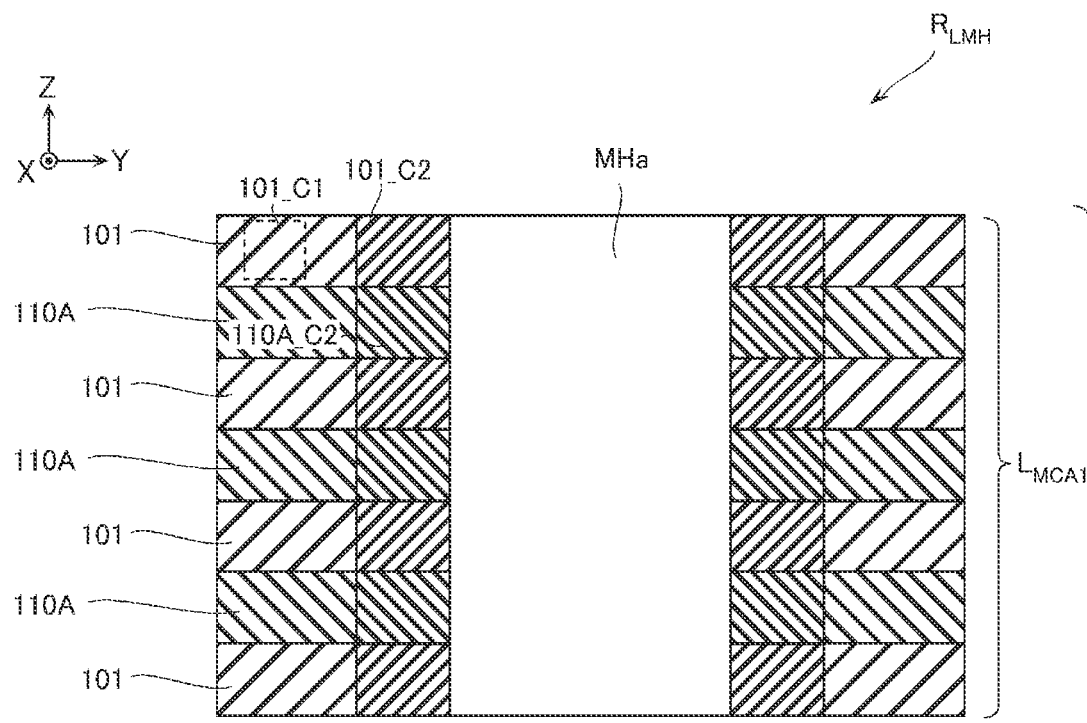
FIG. 10 is a schematic cross-sectional view illustrating the method for producing the semiconductor memory device.
Figure 10:
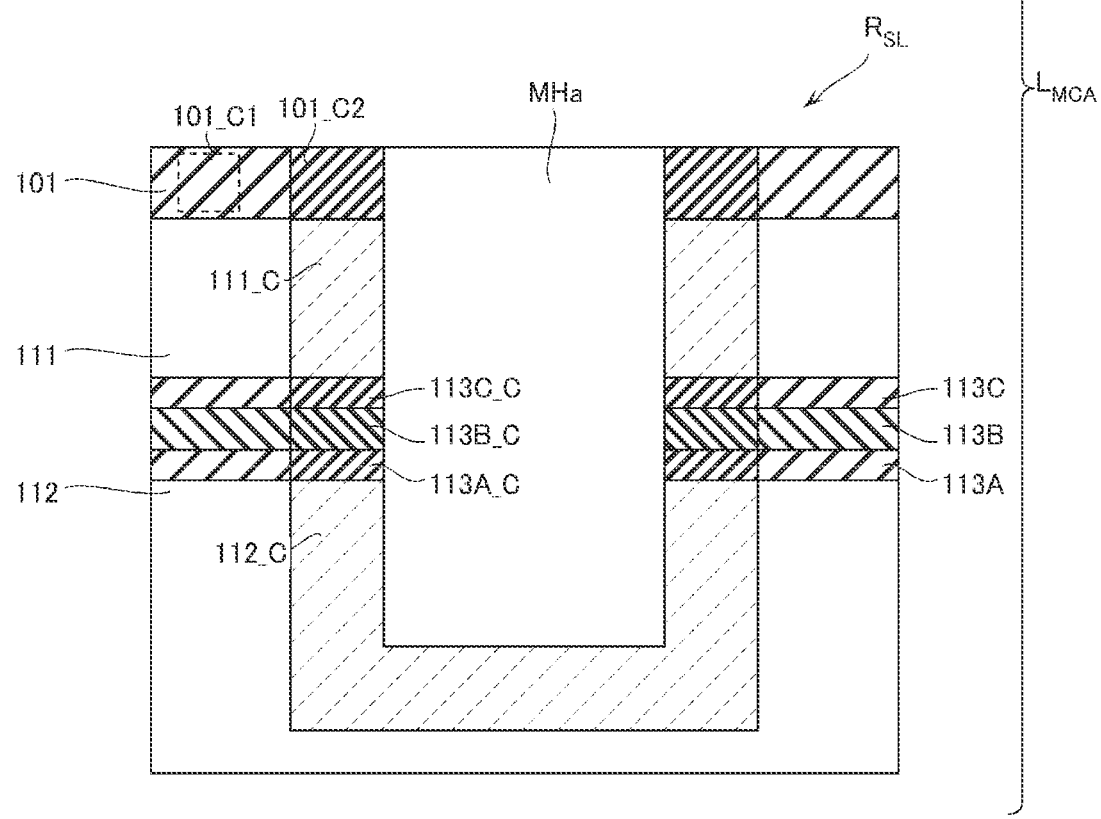

As illustrated in FIGS. 9 and 10, for example, regions 111_C and 112_C containing an impurity such as phosphorus (P), arsenic (As), carbon (C), and argon (Ar) are formed inside the semiconductor layers 111 and 112 via the openings MHa. For example, this process is performed by ion implantation and the like. In the process of ion implantation, the impurity such as phosphorus (P), arsenic (As), carbon (C), and argon (Ar) is used as a dopant.

In this process, an impurity such as phosphorus (P), arsenic (As), carbon (C), and argon (Ar) is implanted into the regions 101_C2 closer to each of the openings MHa in the insulating layers 101 and regions 110A_C2 closer to each of the openings MHa in the sacrificial layers 110A, as illustrated in FIG. 10. Similarly, an impurity such as phosphorus (P), arsenic (As), carbon (C), and argon (Ar) is implanted into regions 113A_C, 113B_C, and 113C_C closer to each of the openings MHa in the sacrificial layers 113A, 113B, and 113C, respectively. In this process, the openings MHa have a shape in which the opening width decreases toward a lower portion. Even when ion implantation is performed at an angle substantially perpendicular to the substrate, the impurity is simultaneously implanted into a region close to a side wall of each of the openings MHa, such as the regions 101_C2. Into a region far from the side wall of each of the openings MHa, such as the regions 101_C1, the impurity is hardly implanted.

Figure 11:
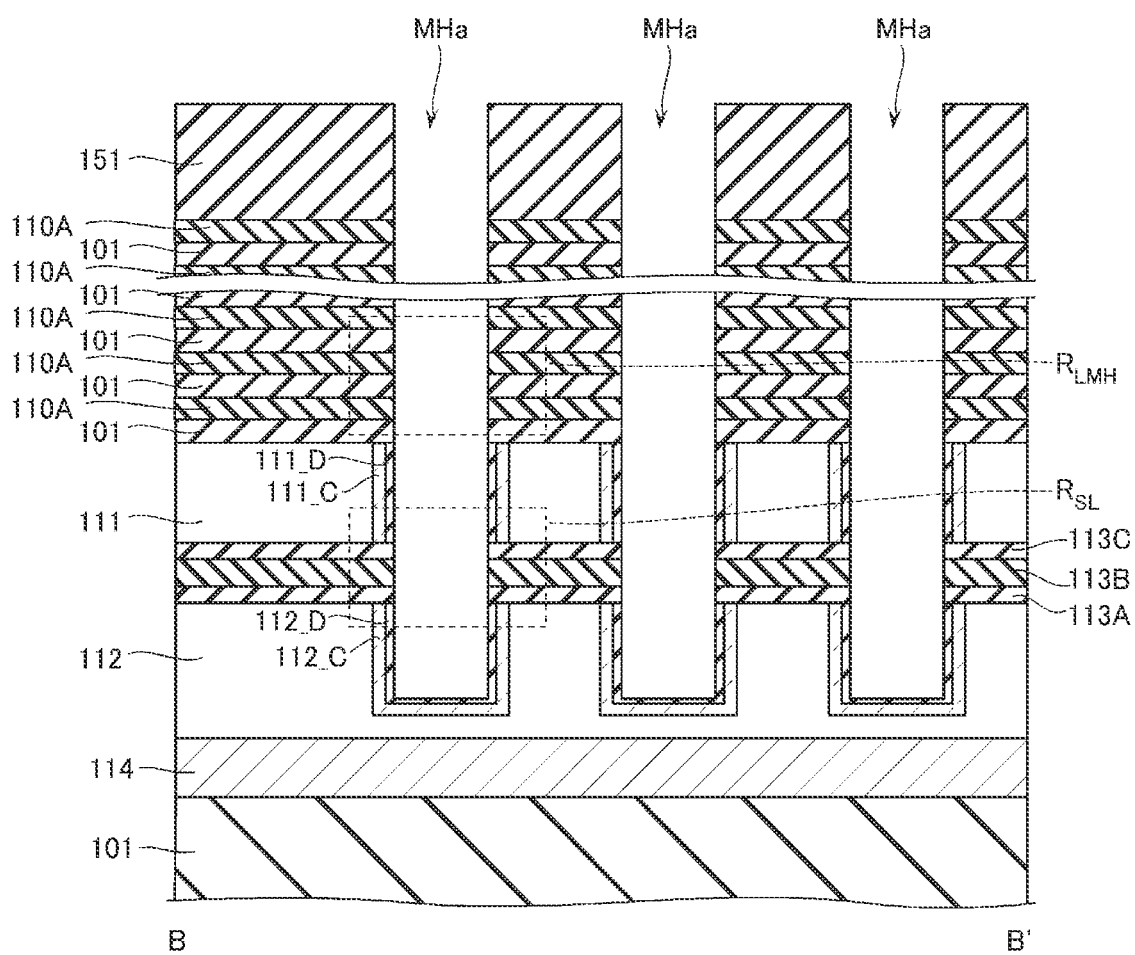
FIG. 11 is a schematic cross-sectional view illustrating the method for producing the semiconductor memory device.
Figure 12:
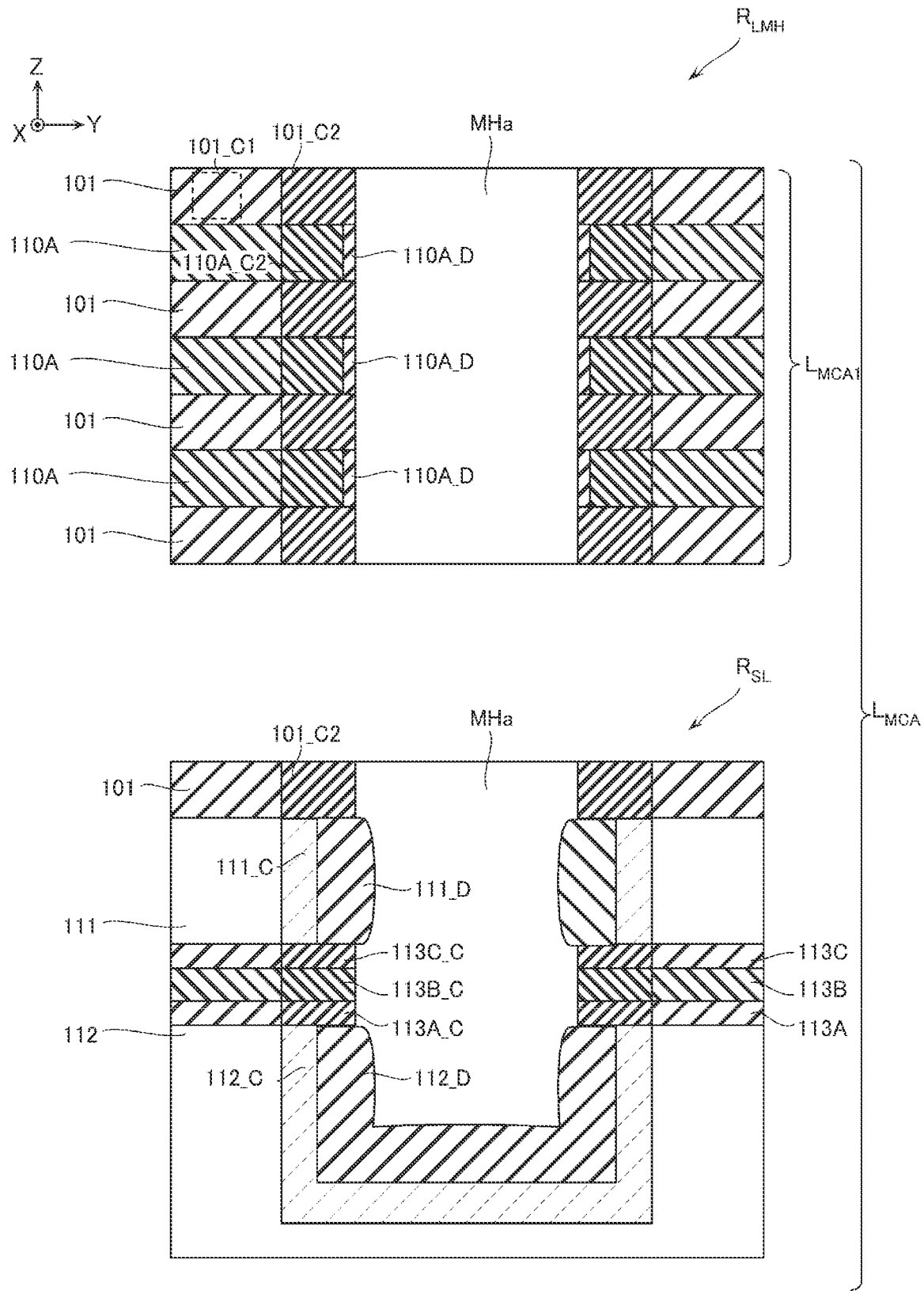
FIG. 12 is a schematic cross-sectional view illustrating the method for producing the semiconductor memory device.

As illustrated in FIGS. 11 and 12, for example, insulating layers 111_D and 112_D made of silicon oxide and the like are then formed at portions (the regions 111_C and 112_C, respectively) where the semiconductor layers 111 and 112 are exposed to the openings MHa. For example, this process is performed by thermal oxidation and the like. The regions 111_C and 112_C are a region where many crystal defects are generated by the ion implantation process described with reference to FIGS. 9 and 10. An oxidation reaction at such regions 111_C and 112_C proceeds faster than an oxidation reaction at a region where many crystal defects are not generated.

As illustrated in FIG. 12, portions where the sacrificial layers 110A are exposed to each of the openings MHa in the region $R_{LMH}$ are also partially oxidized, to form insulating layers 110A_D made of silicon oxide and the like. As described above, the oxidation reaction that forms the insulating layers 111_D and 112_D proceeds relatively fast. Therefore, since a time required for completion of an oxidation process is relatively short, the insulating layers 110A_D that are relatively thin are formed.

Figure 13:
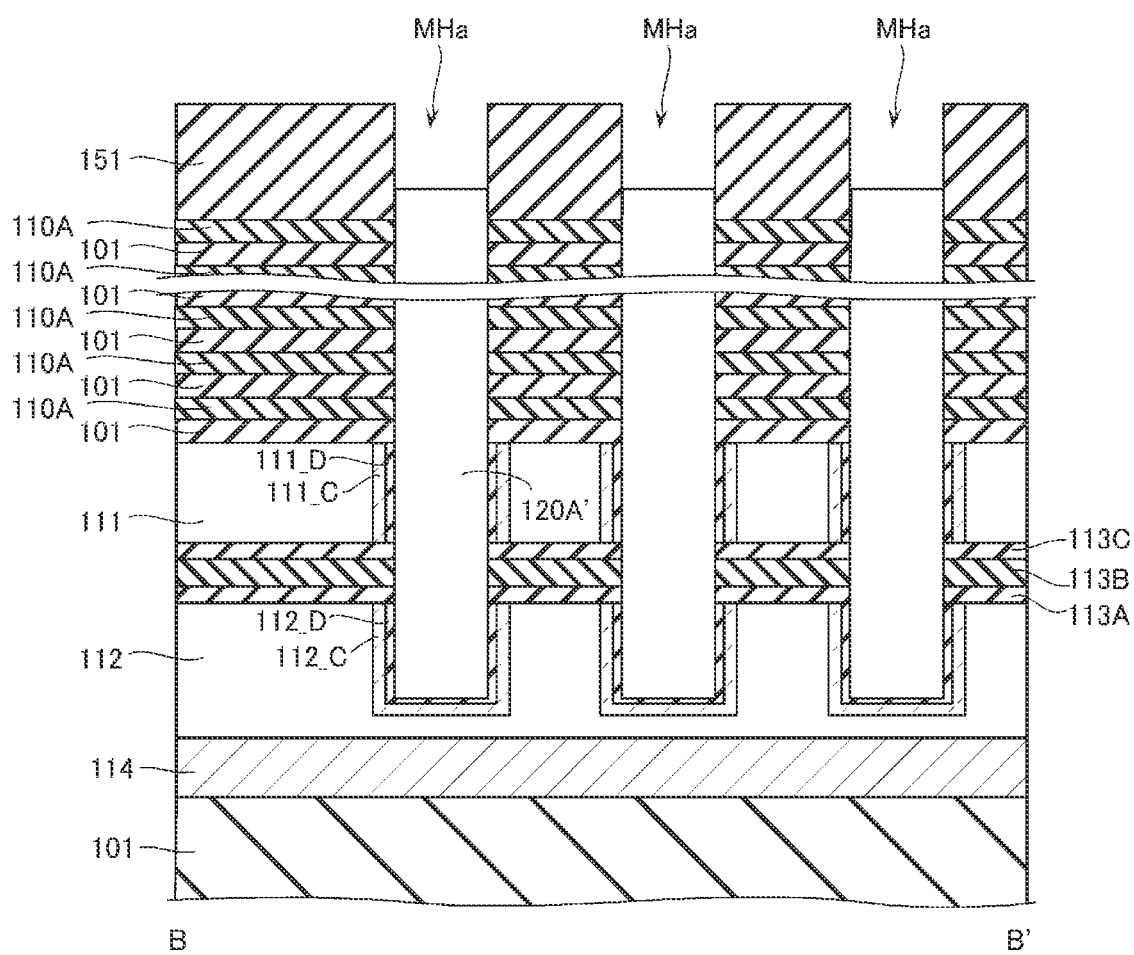
FIG. 13 is a schematic cross-sectional view illustrating the method for producing the semiconductor memory device.

As illustrated in FIG. 13, for example, sacrificial layers 120A' made of amorphous silicon and the like are then formed in the openings MHa, and the sacrificial layers 120A' are removed so that the upper surface of each of the sacrificial layers 120A' is positioned between the upper surface and the lower surface of the insulating layer 151. For example, this process is performed by CVD, RIE, and the like.

Figure 14:
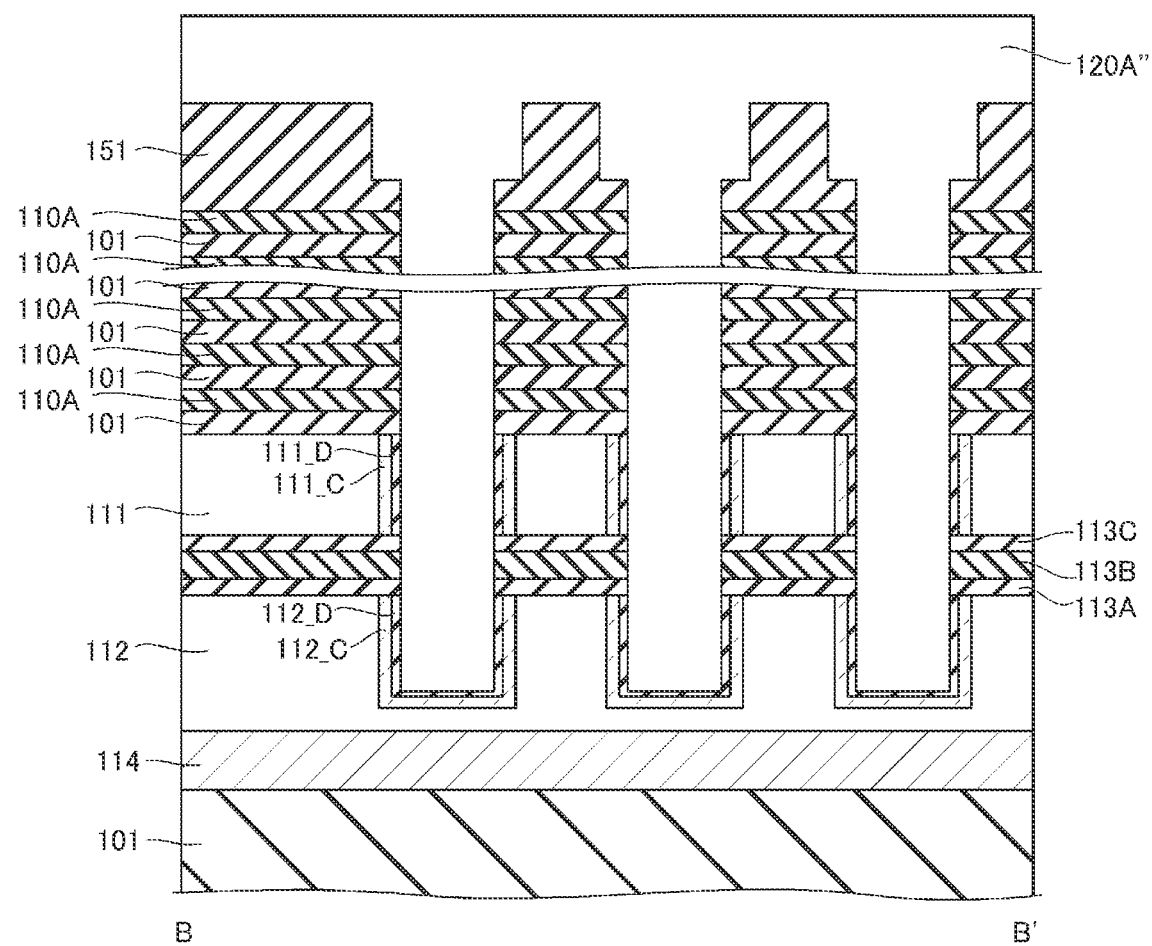
FIG. 14 is a schematic cross-sectional view illustrating the method for producing the semiconductor memory device.

As illustrated in FIG. 14, for example, an opening part at the upper end of each of the openings MHa is expanded, and a film is then formed from amorphous silicon and the like, to form a sacrificial layer 120A". For example, this process is performed by wet etching, CVD, and the like.

Figure 15:
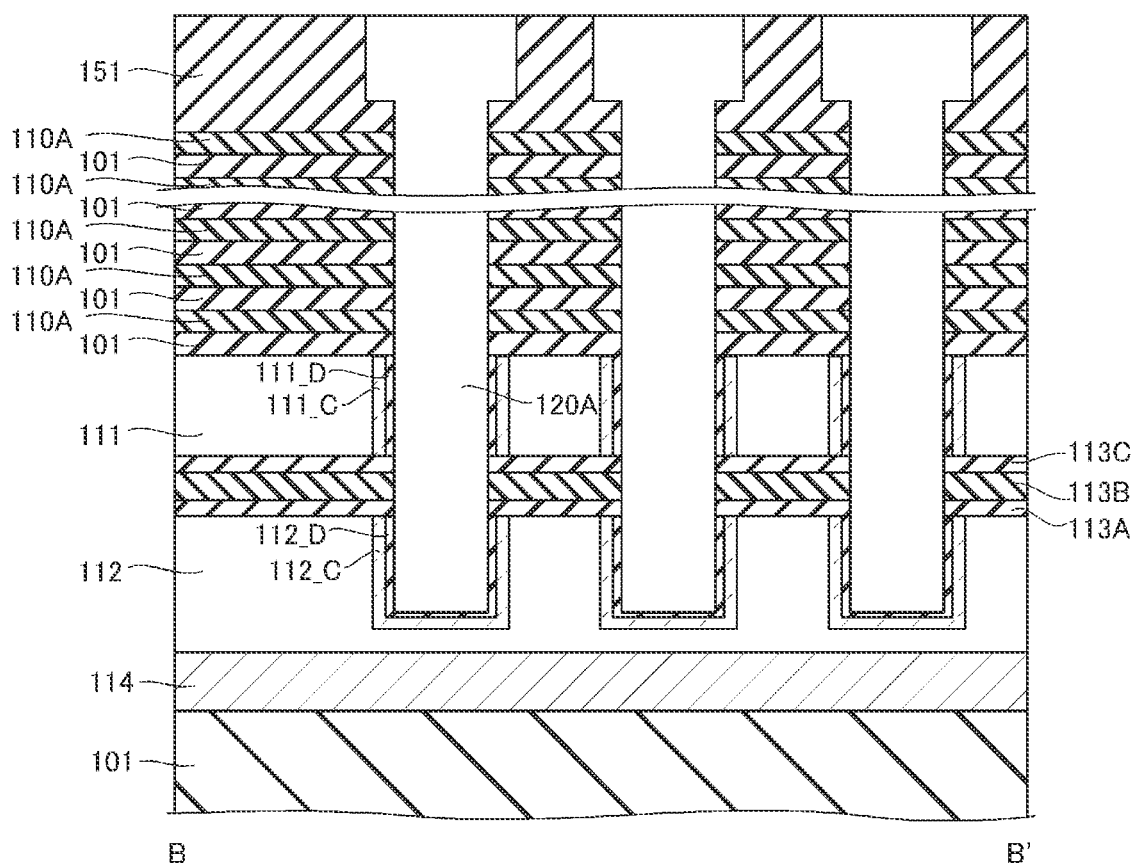
FIG. 15 is a schematic cross-sectional view illustrating the method for producing the semiconductor memory device.

As illustrated in FIG. 15, for example, the sacrificial layer 120A" is removed so that the upper surface of the sacrificial layer 120A" is positioned at the upper surface of the insulating layer 151. Thus, sacrificial layers 120A are formed. For example, this process is performed by RIE and the like.

Figure 16:
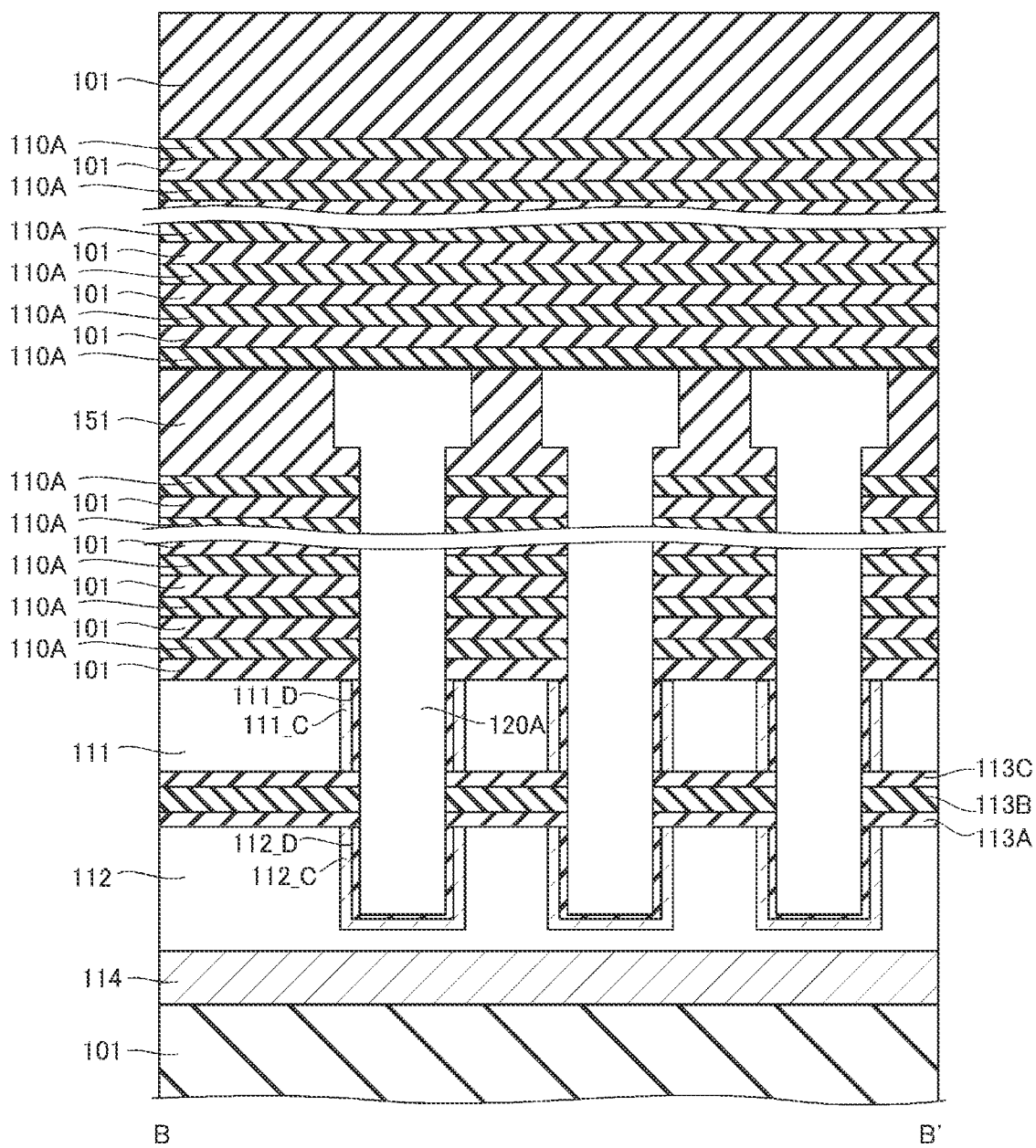
FIG. 16 is a schematic cross-sectional view illustrating the method for producing the semiconductor memory device.

As illustrated in FIG. 16, for example, the sacrificial layers 110A and the insulating layers 101 are further alternately formed on the insulating layer 151. For example, this process is performed by a method such as CVD.

Figure 17:
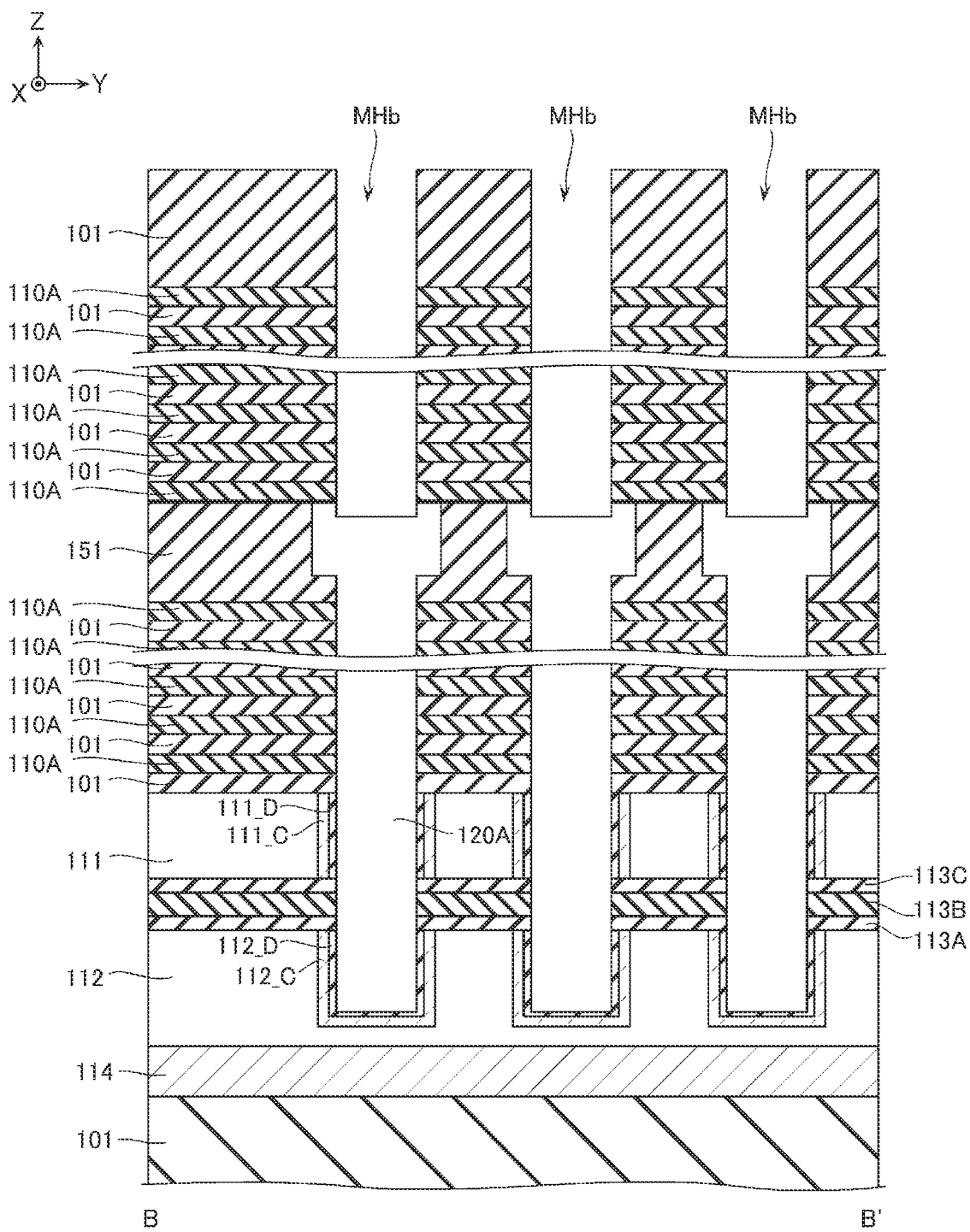
FIG. 17 is a schematic cross-sectional view illustrating the method for producing the semiconductor memory device.

As illustrated in FIG. 17, for example, a plurality of openings MHb are formed at positions corresponding to the semiconductor regions $120_U$. The openings MHb extend in the Z direction, and penetrate the sacrificial layers 110A and the insulating layers 101, and the sacrificial layers 120A are exposed to the openings MHb. For example, this process is performed by a method such as RIE.

Figure 18:
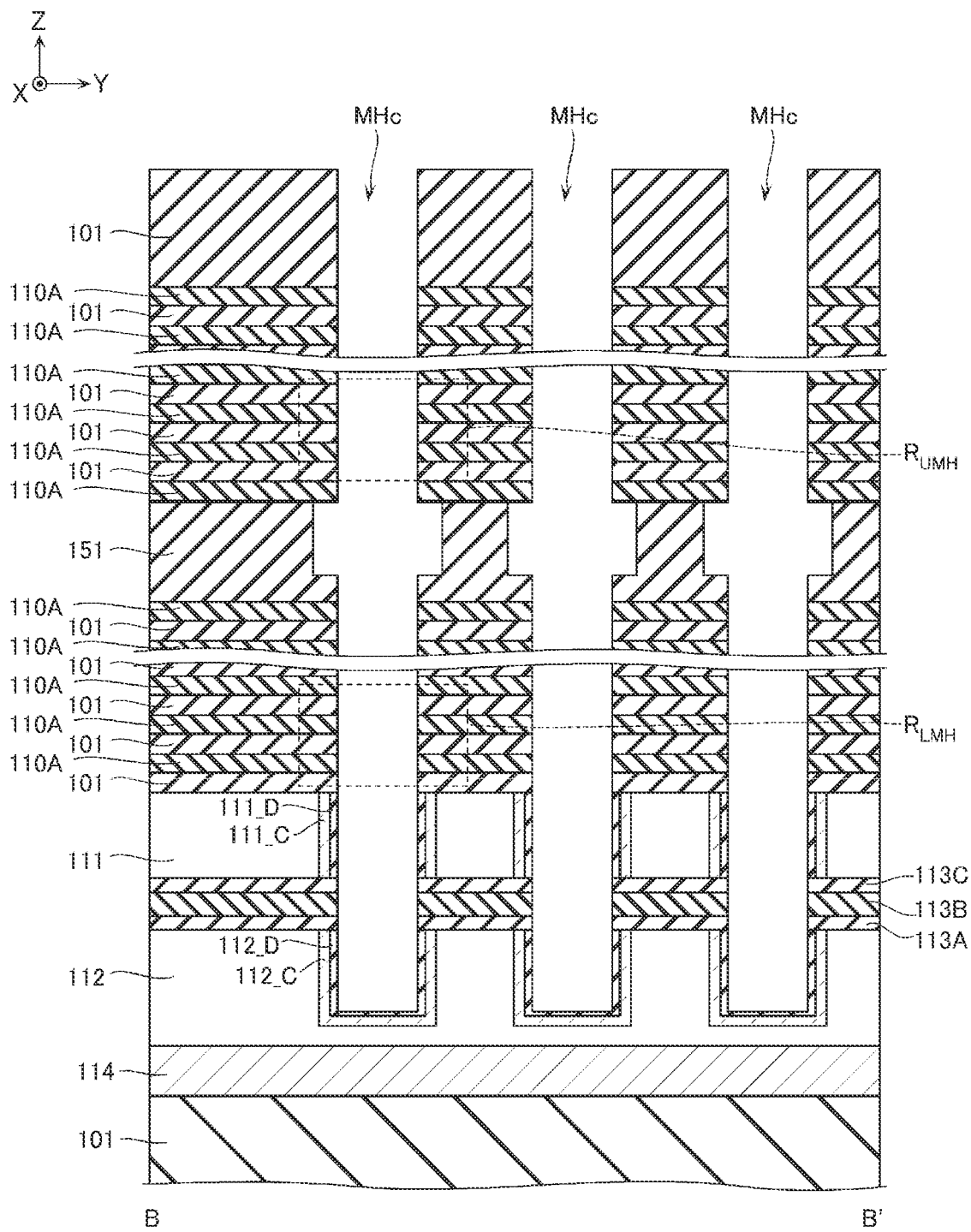
FIG. 18 is a schematic cross-sectional view illustrating the method for producing the semiconductor memory device.
Figure 19:
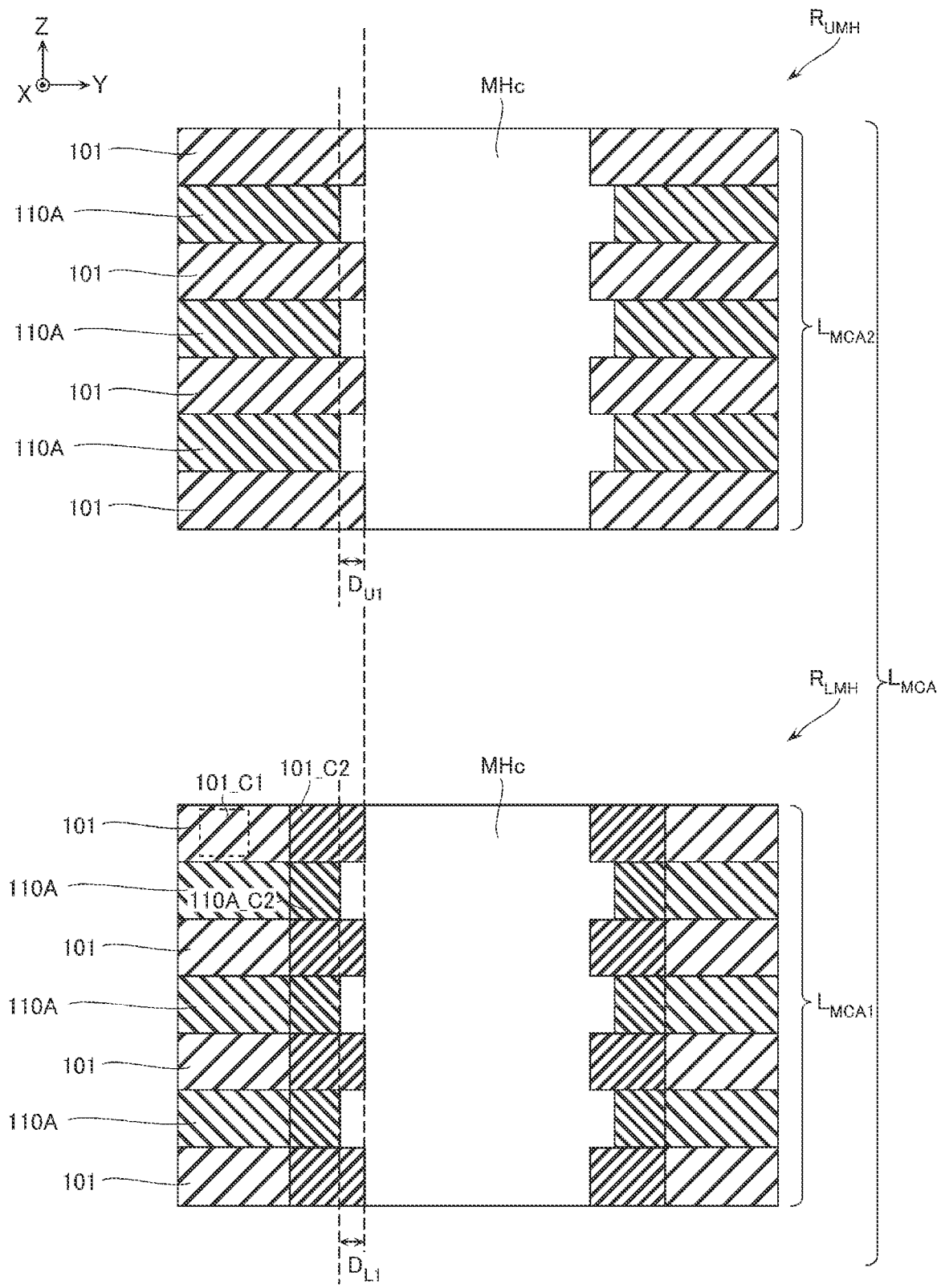
FIG. 19 is a schematic cross-sectional view illustrating the method for producing the semiconductor memory device.

As illustrated in FIG. 18, for example, the sacrificial layers 120A are removed, to form openings MHc. For example, this process is performed by a method such as wet etching. The semiconductor layers 111 and 112 contain silicon (Si) and the like that are the same as an element contained in the sacrificial layer 120A. However, the semiconductor layers 111 and 112 are protected by the insulating layers 111_D and 112_D, which act as an etching stopper. In this process, the semiconductor layers 111 and 112 are not etched.

As illustrated in FIG. 19, for example, the sacrificial layers 110A are partially removed in each of the openings MHc. As a result, the opening widths in the X and Y directions at the sacrificial layers 110A are expanded by a predetermined amount with respect to the opening width at the insulating layers 101. For example, this process is performed by wet etching using phosphoric acid and the like.

In this process, the insulating layers 110A_D (FIG. 12) made of silicon oxide and the like are etched before the sacrificial layers 110A made of silicon nitride and the like are etched at the region $R_{LMH}$. In this process, due to use of phosphoric acid and the like, it takes a relatively long time to etch silicon oxide and the like. However, since the thickness of the insulating layers 110A_D in this embodiment is relatively small as described above, the etching is performed for a relatively short time. Accordingly, in this process, the width $D_{U1}$ by which the sacrificial layers 110A at the region $R_{UMH}$ are shifted backward is substantially the same as the width $D_{L1}$ by which the sacrificial layers 110A at the region $R_{LMH}$ are shifted backward.

Figure 20:
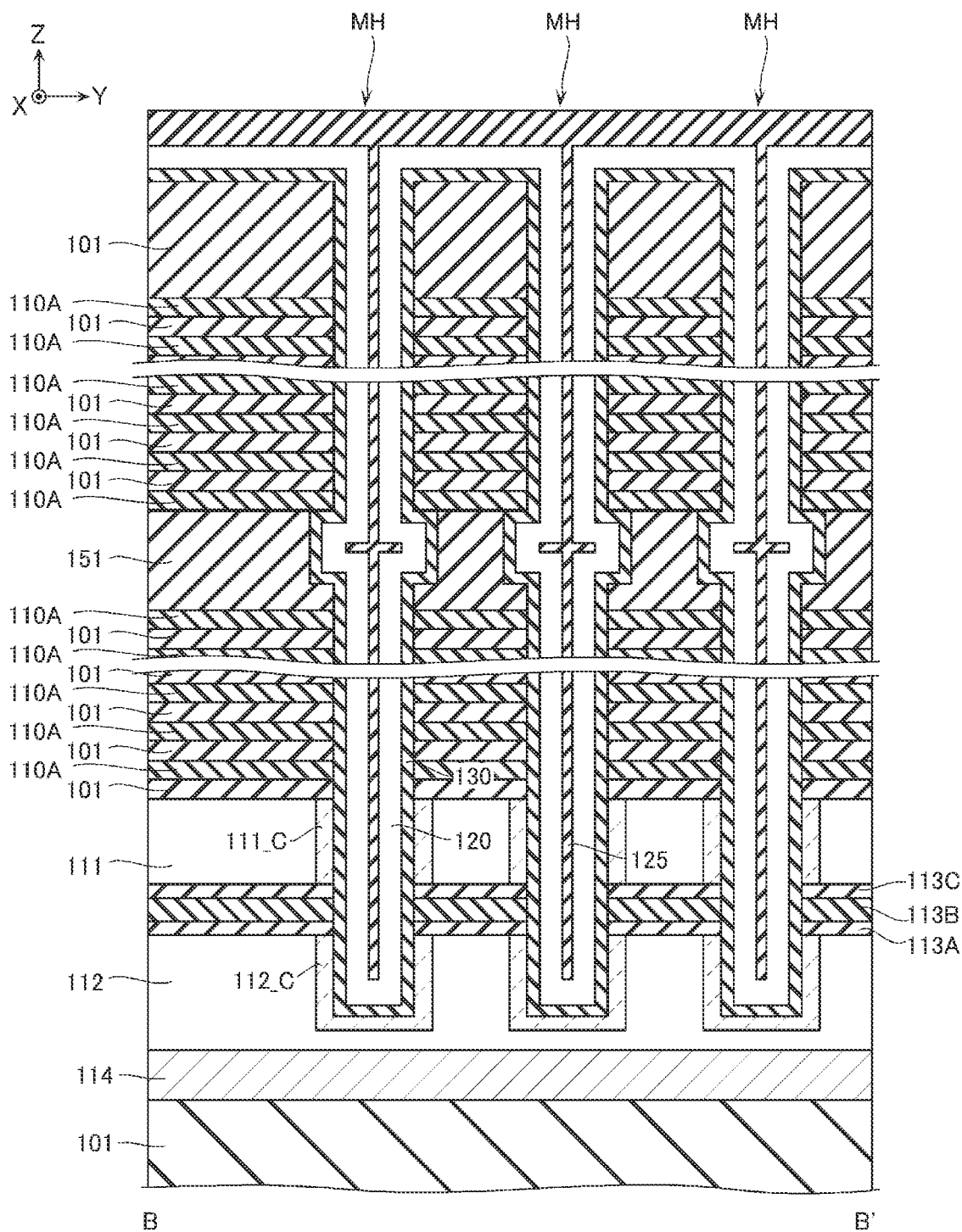
FIG. 20 is a schematic cross-sectional view illustrating the method for producing the semiconductor memory device.

As illustrated in FIG. 20, for examples, each of the gate insulating films 130, each of the semiconductor layers 120, and each of the insulating layers 125 are formed on the upper surface of the insulating layer 101 that is an uppermost layer and the internal circumferential surface of each of the openings MHc, to form a memory hole MH. During formation of the semiconductor layers 120, for example, a film is formed by CVD and the like. Thus, an amorphous silicon film is formed in each of the memory holes MH. For example, a crystal structure of this amorphous silicon film is modified by an annealing process and the like.

Figure 21:
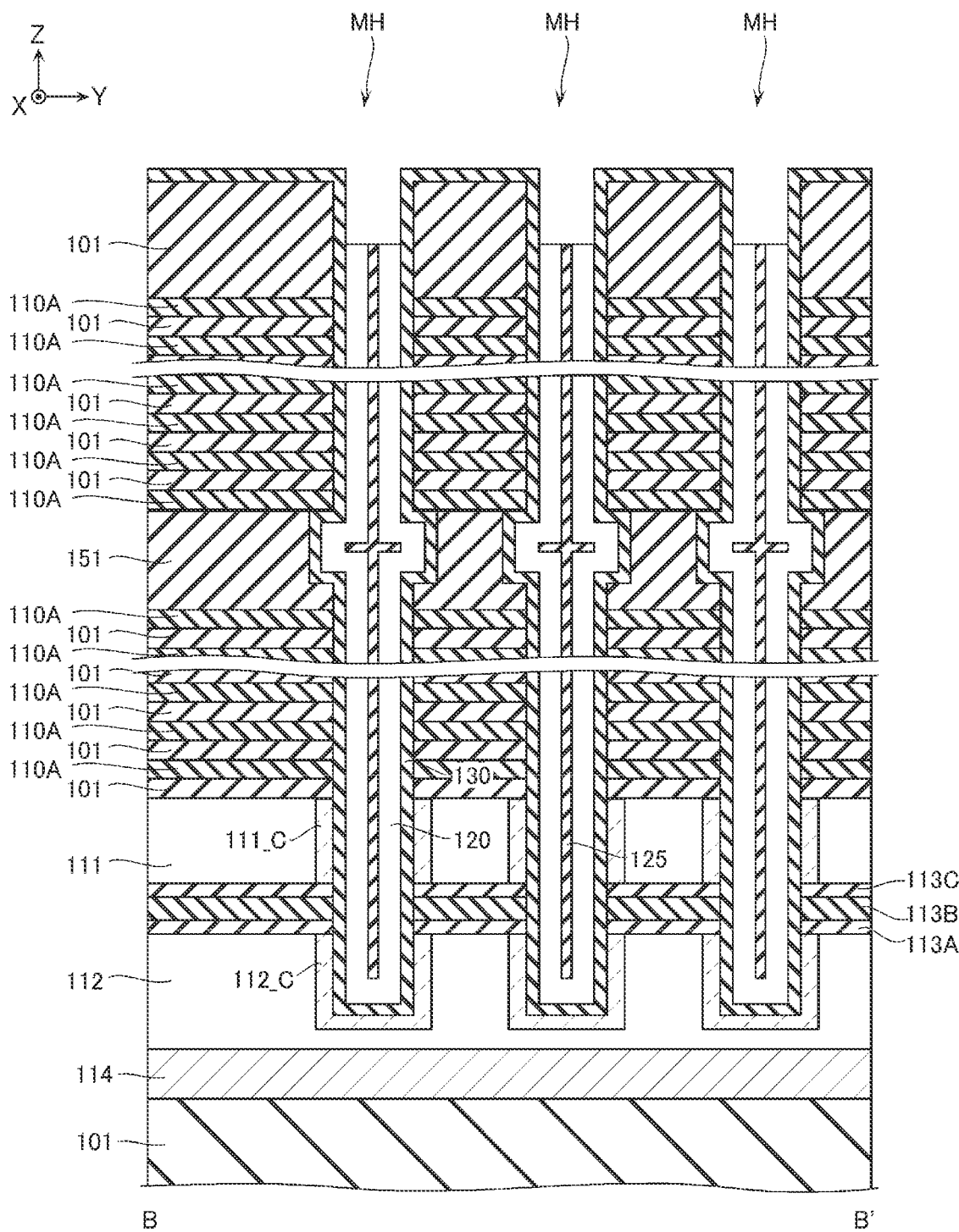
FIG. 21 is a schematic cross-sectional view illustrating the method for producing the semiconductor memory device.

As illustrated in FIG. 21, for example, the insulating layers 125 and the semiconductor layers 120 are then partially removed so that the upper surface of the semiconductor layers 120 and the like is positioned between the upper surface and the lower surface of the insulating layer 101 that is the uppermost layer. For example, this process is performed by a method such as RIE.

Figure 22:
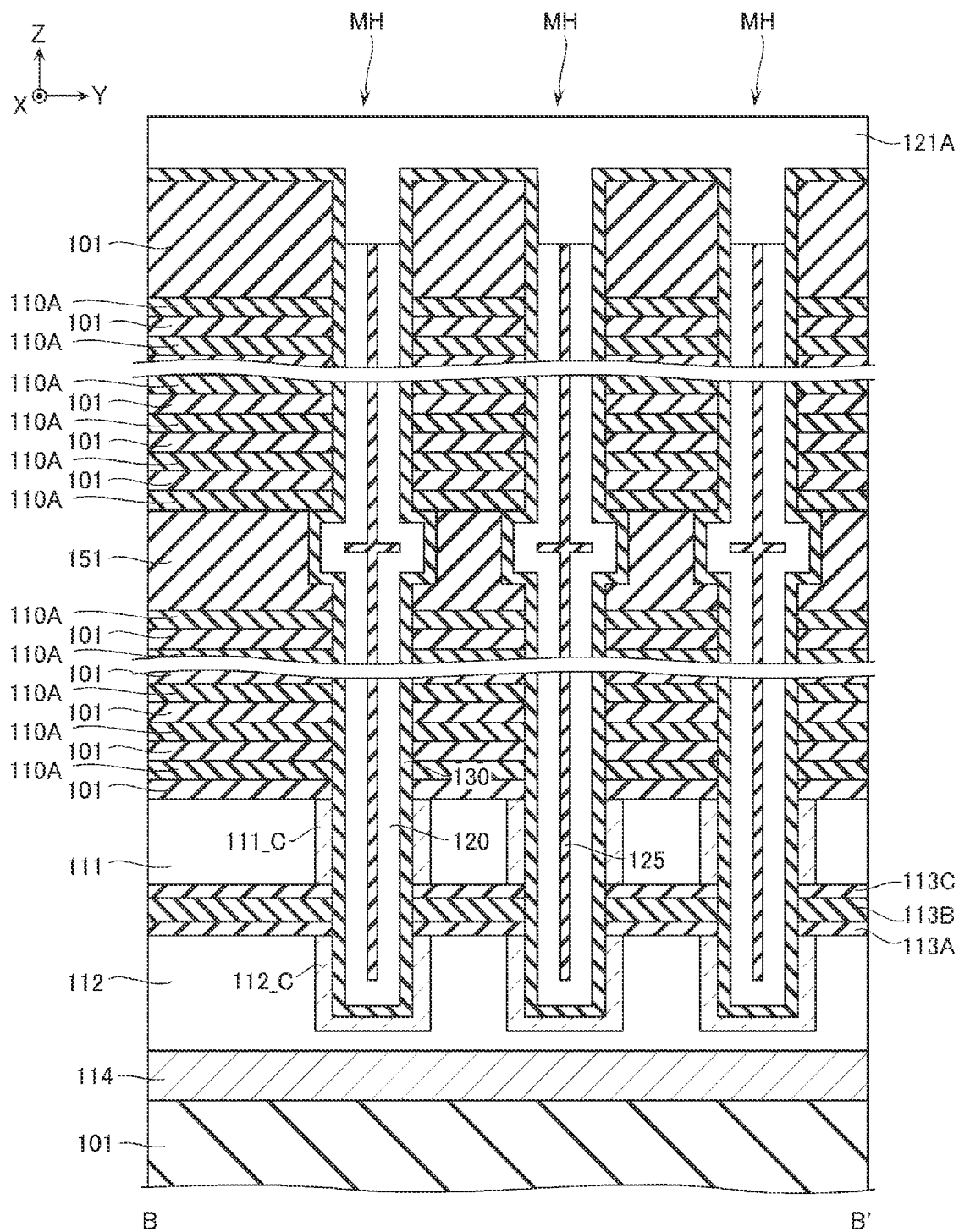
FIG. 22 is a schematic cross-sectional view illustrating the method for producing the semiconductor memory device.

As illustrated in FIG. 22, for example, a semiconductor layer 121A is then formed in the vicinity of upper ends of the memory holes MH. For example, the semiconductor layer 121A contains amorphous silicon containing an N-type impurity such as phosphorus (P). For example, this process is performed by a method such as CVD.

Figure 23:
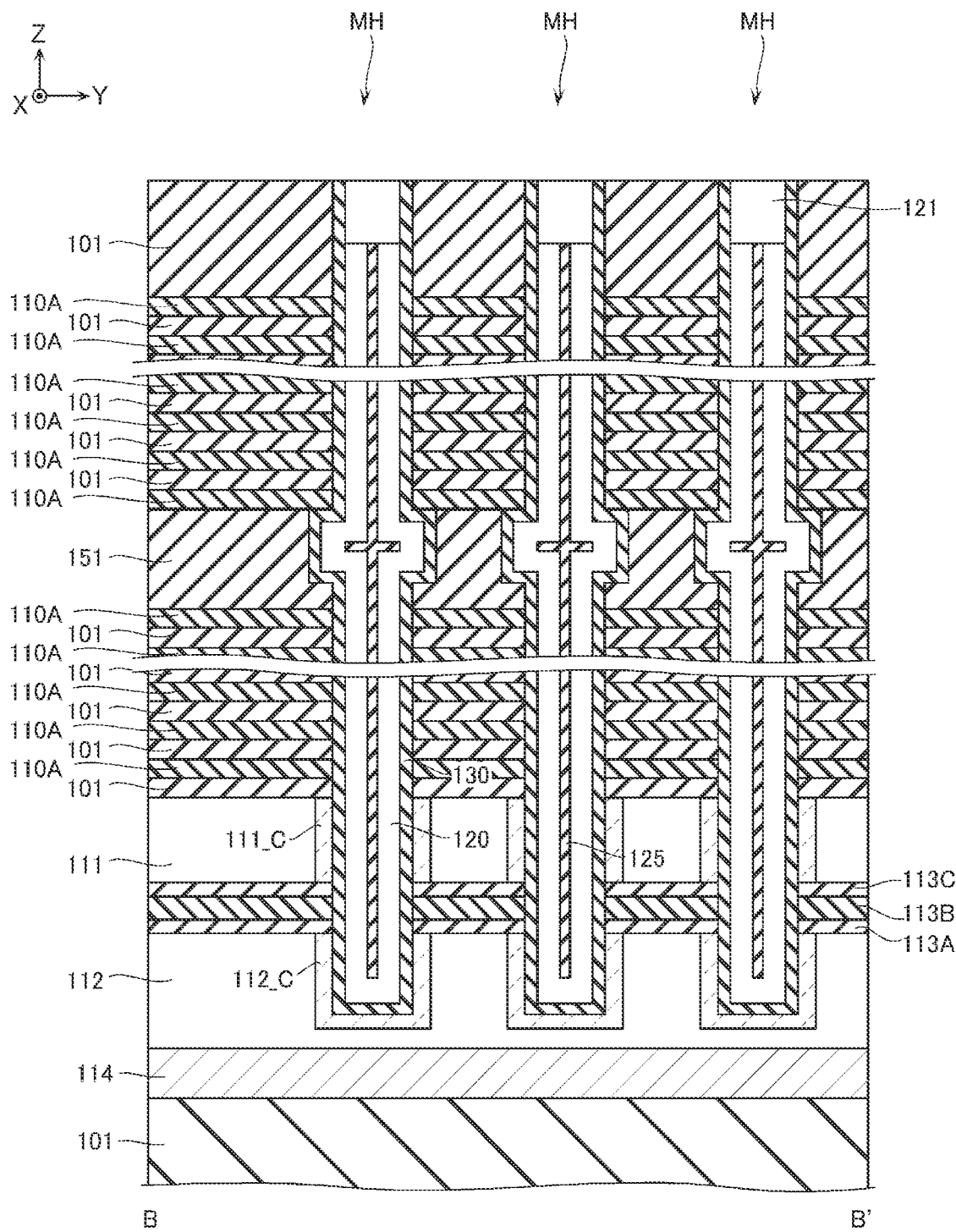
FIG. 23 is a schematic cross-sectional view illustrating the method for producing the semiconductor memory device.

As illustrated in FIG. 23, for example, the impurity regions 121 of the semiconductor layers 120 are then formed in the vicinity of the upper ends of the memory holes MH. In this process, for example, the semiconductor layer 121A is partially removed by a method such as RIE, to expose the insulating layer 101 that is the uppermost layer.

Figure 24:
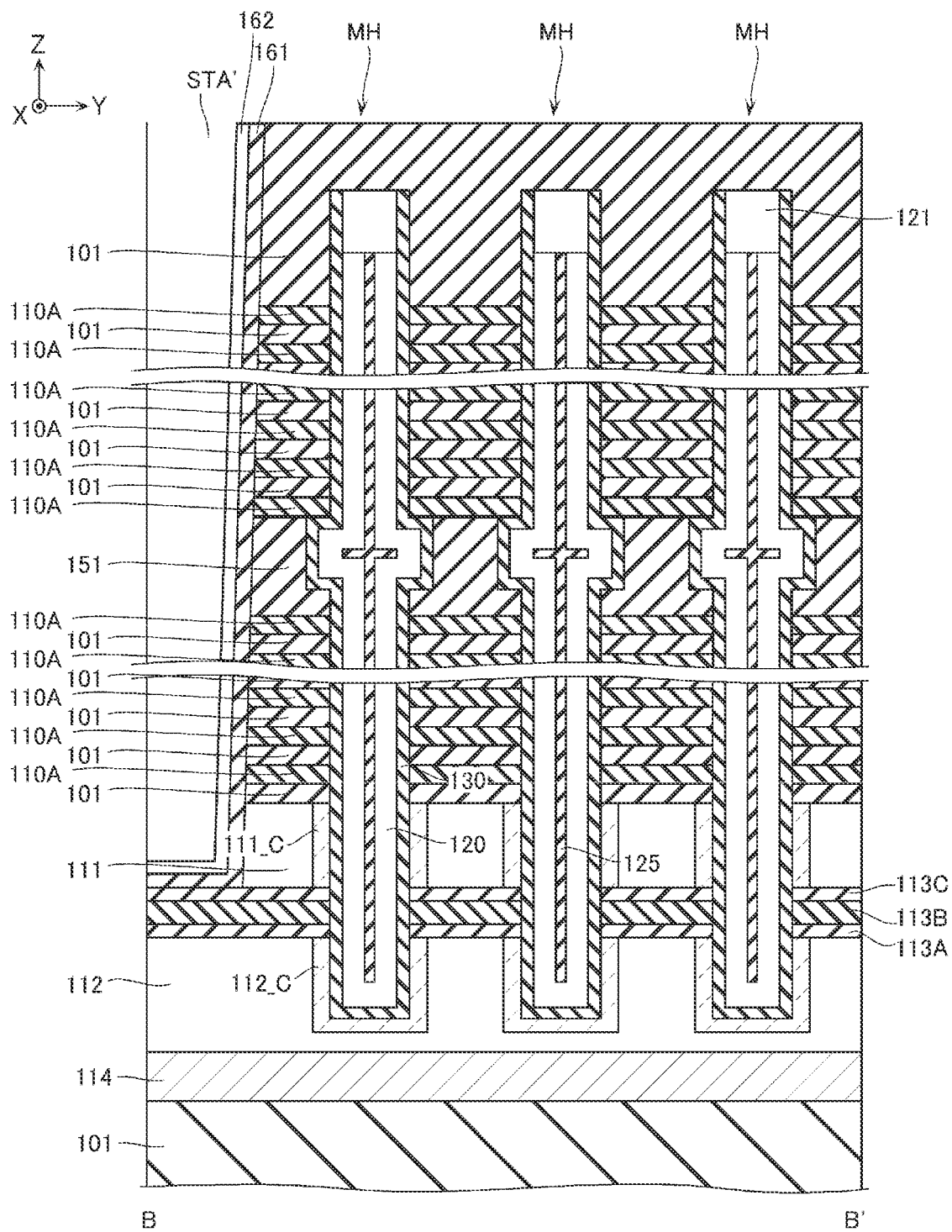
FIG. 24 is a schematic cross-sectional view illustrating the method for producing the semiconductor memory device.

Next, for example, a trench STA' is formed as illustrated in FIG. 24. The trench STA' extends in the Z and X directions, and divides the insulating layers 101 and the sacrificial layers 110A in the Y direction, and the semiconductor layer 111 is exposed to the trench STA'. For example, this process is performed by a method such as RIE. In the trench STA', an insulating layer 161 made of silicon oxide and the like and a semiconductor layer 162 made of amorphous silicon and the like are formed by a method such as CVD.

Figure 25:
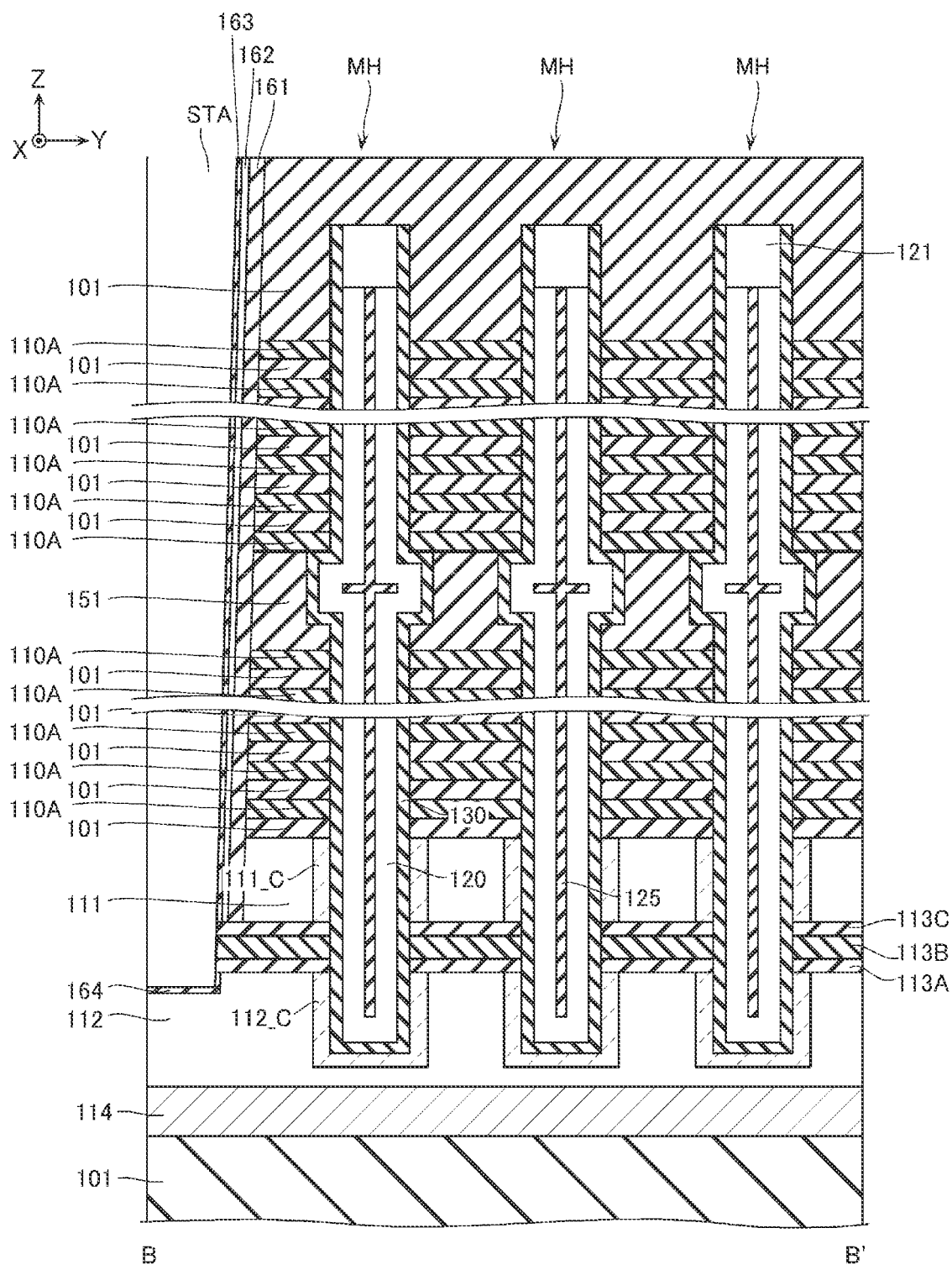
FIG. 25 is a schematic cross-sectional view illustrating the method for producing the semiconductor memory device.

Next, for example, a trench STA is formed as illustrated in FIG. 25. The trench STA is formed by further dividing the semiconductor layer 162, the insulating layer 161, the semiconductor layer 111, and the sacrificial layers 113C, 113B, and 113A in the Y direction from the bottom surface of the trench STA', and exposing the semiconductor layer 112. For example, this process is performed by RIE and the like. The semiconductor layer 162 that is the side face in the Y direction of the trench STA and a part of the semiconductor layer 112 exposed to the bottom surface are oxidized, to form an insulating layer 163 and an insulating layer 164, respectively, that are made of silicon oxide and the like. For example, this process is performed by thermal oxidation or the like.

Figure 26:
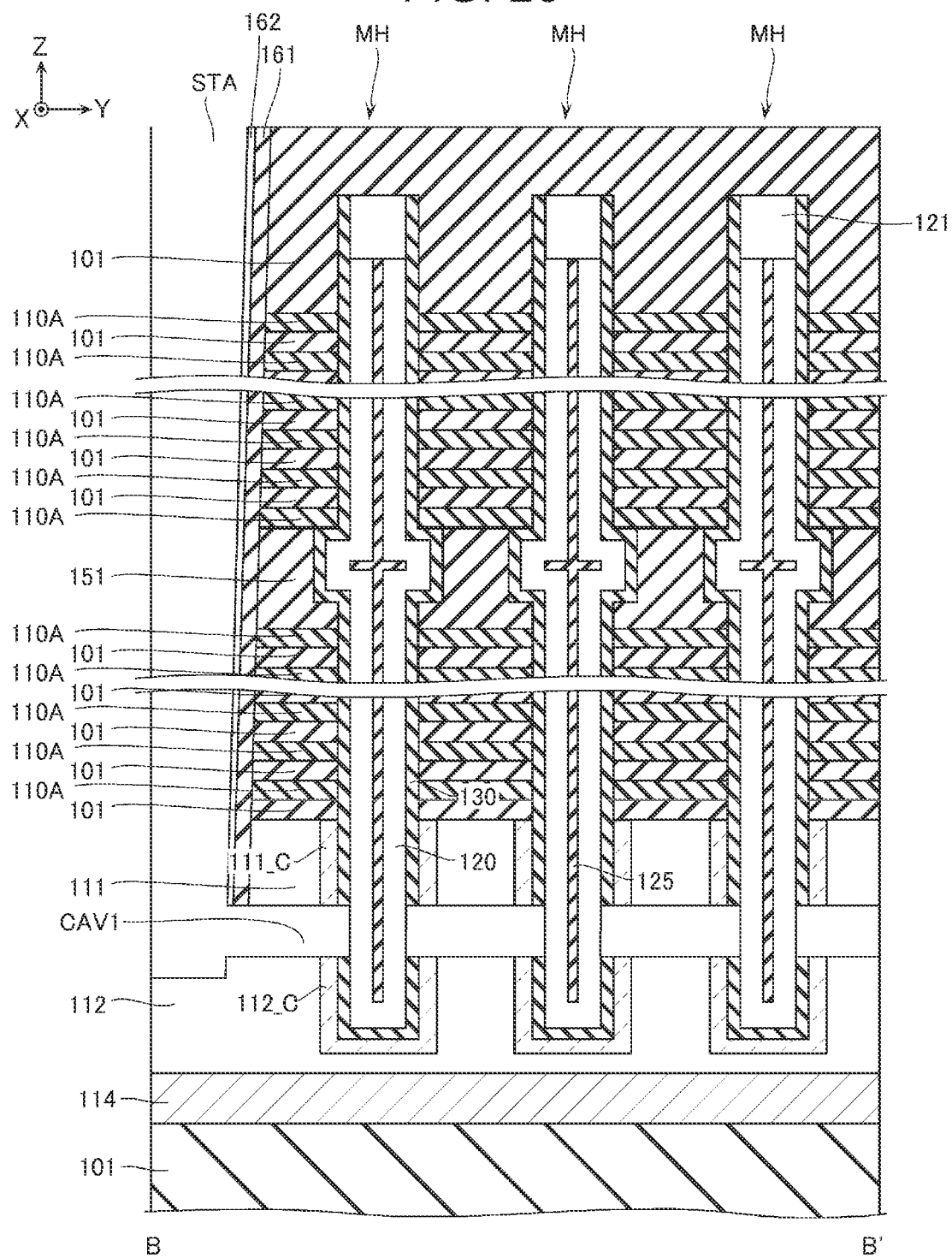
FIG. 26 is a schematic cross-sectional view illustrating the method for producing the semiconductor memory device.

As illustrated in FIG. 26, for example, the sacrificial layer 113B is removed via the trench STA, and the sacrificial layers 113A and 113B and a part of the gate insulating films 130 are then removed, to form a cavity CAV1. Thus, a part of the semiconductor layers 120 is exposed. For example, this process is performed by a method such as wet etching.

Figure 27:
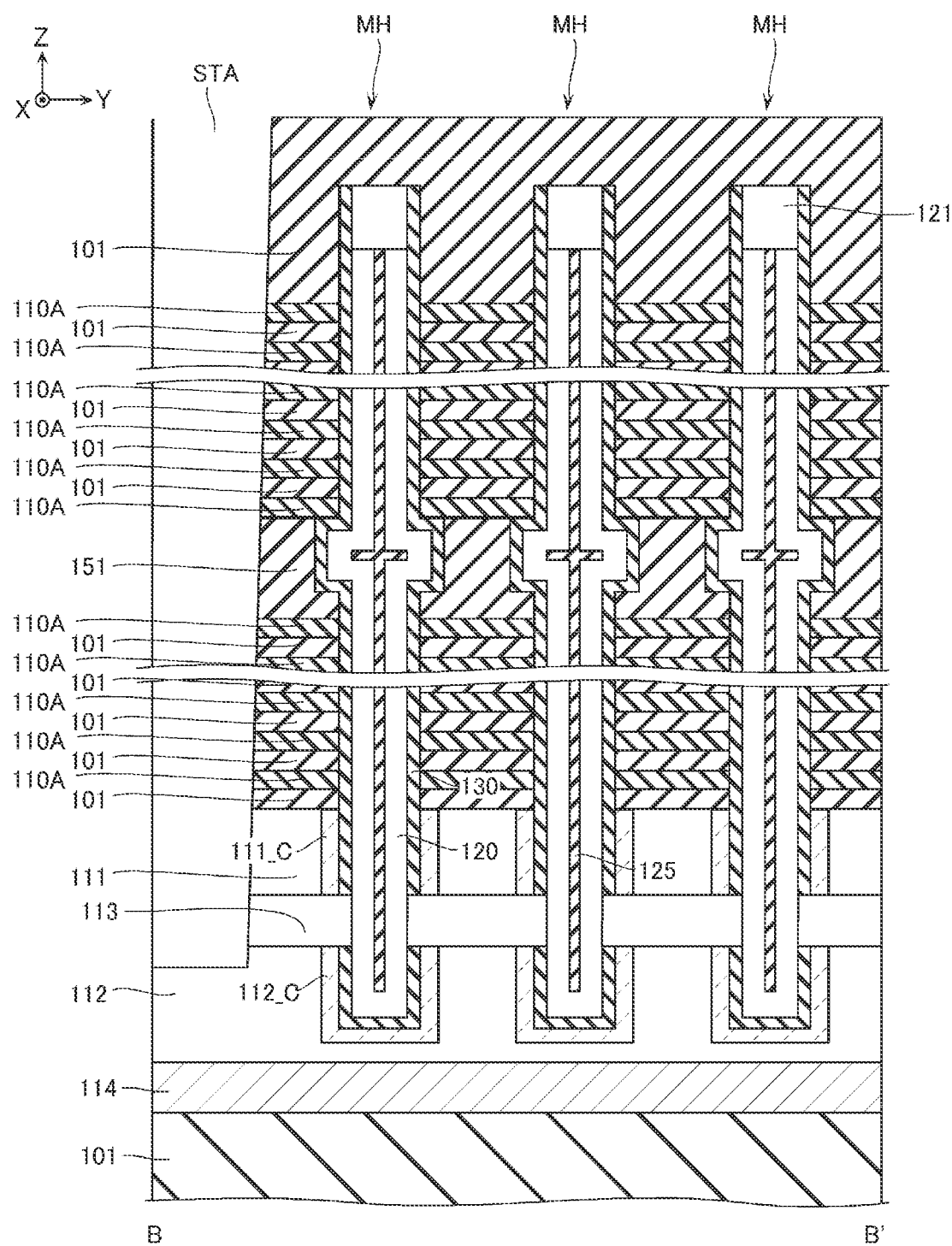
FIG. 27 is a schematic cross-sectional view illustrating the method for producing the semiconductor memory device.

Next, for example, the semiconductor layer 113 is formed via the trench STA at a position where there is the cavity CAV1 as illustrated in FIG. 27. For example, this process is performed by a method such as epitaxial growth. The semiconductor layer 162 and the insulating layer 161 on the side face in the Y direction of the trench STA are removed. For example, this process is performed by a method such as wet etching.

Figure 28:
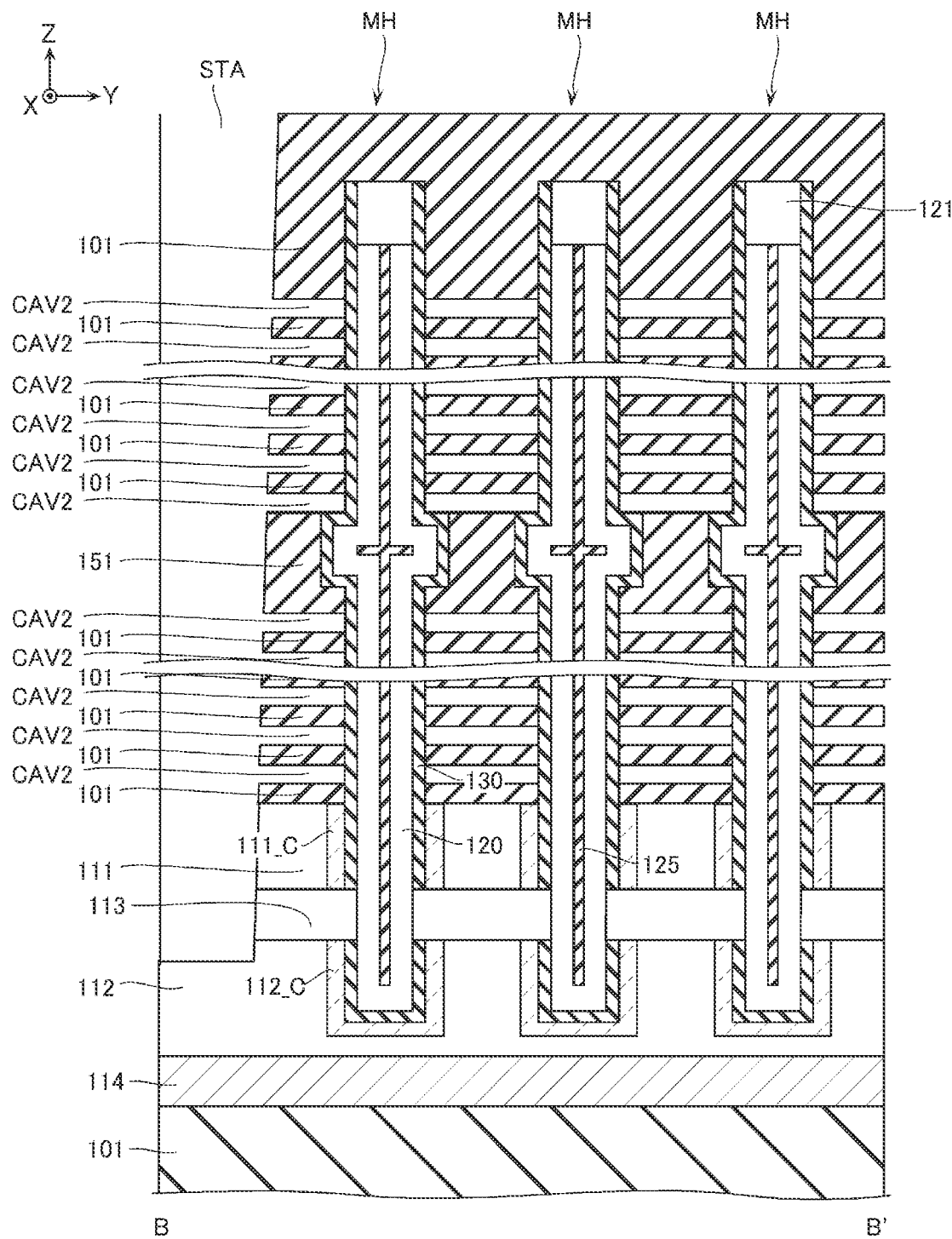
FIG. 28 is a schematic cross-sectional view illustrating the method for producing the semiconductor memory device.

Next, for example, the sacrificial layers 110A are removed via the trench STA, to form a plurality of cavities CAV2, as illustrated in FIG. 28. Thus, a hollow structure including the insulating layers 101 disposed in the Z direction and a structure (the semiconductor layers 120, the gate insulating films 130, and the insulating layers 125) in each of the memory holes MH that supports the insulating layers 101 is formed. For example, this process is performed by a method such as wet etching.

Figure 29:
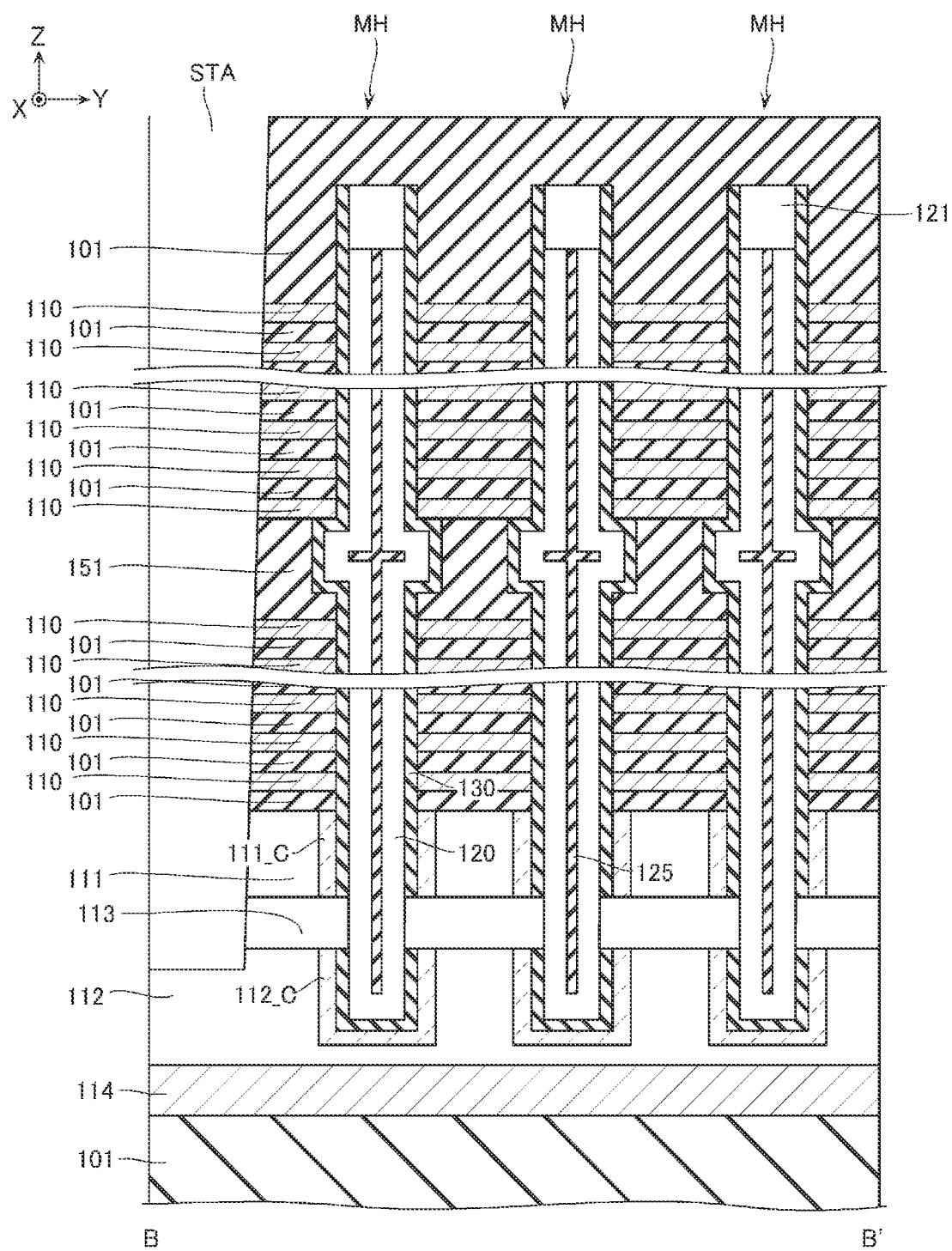
FIG. 29 is a schematic cross-sectional view illustrating the method for producing the semiconductor memory device.

Next, for example, the conductive layers 110 are formed in the cavities CAV2 as illustrated in FIG. 29. For example, this process is performed by a method such as CVD.

Subsequently, the inter-block structure ST is formed in the trench STA, and the contact Ch connected to each of the impurity regions 121, the inter-string unit insulating layer SHE, and the like are formed. Thus, a structure described with reference to FIG. 5 is formed.

COMPARATIVE EXAMPLE

Figure 30:
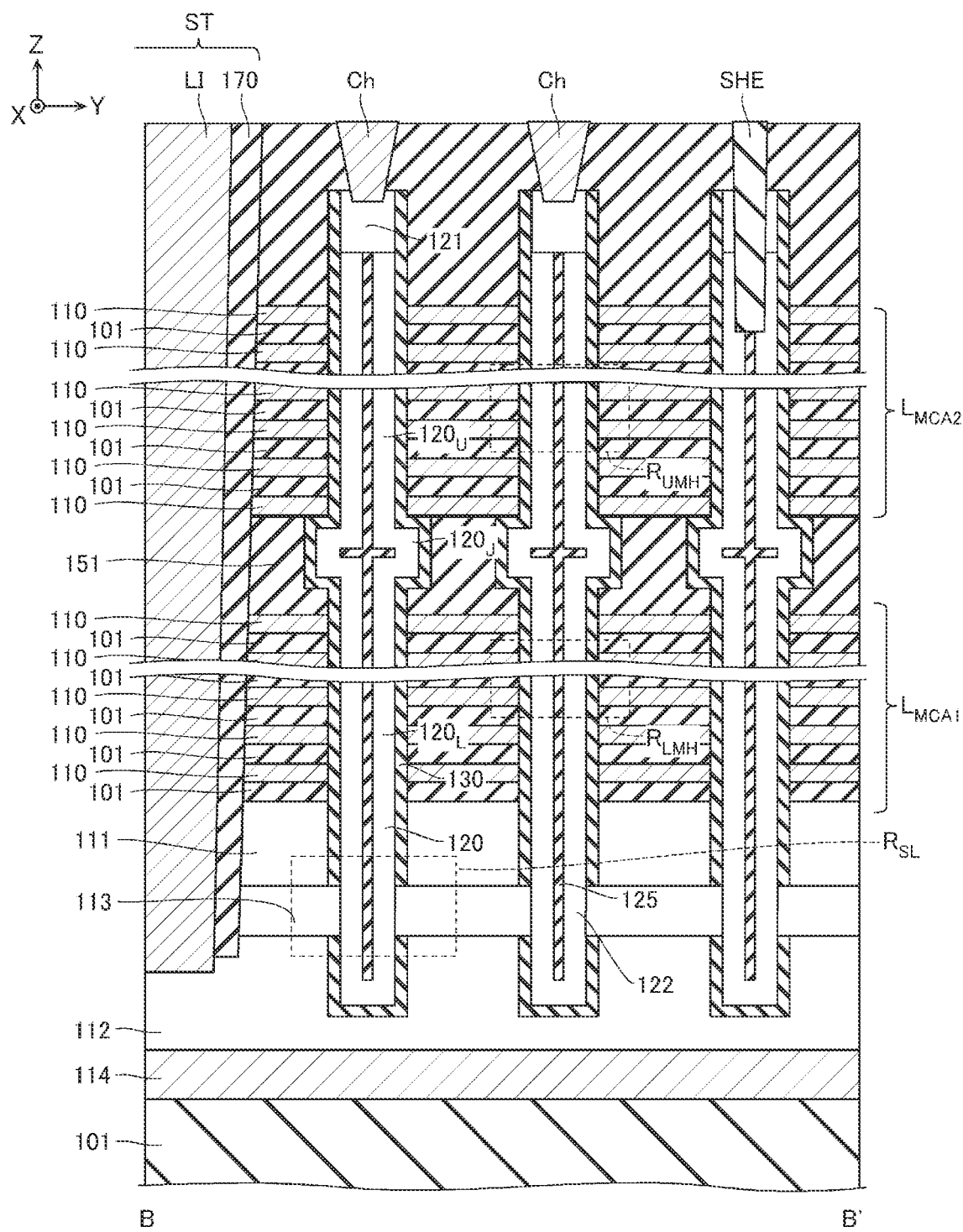
FIG. 30 is a schematic cross-sectional view illustrating a configuration of a part of a semiconductor memory device according to a Comparative Example.
Figure 31:
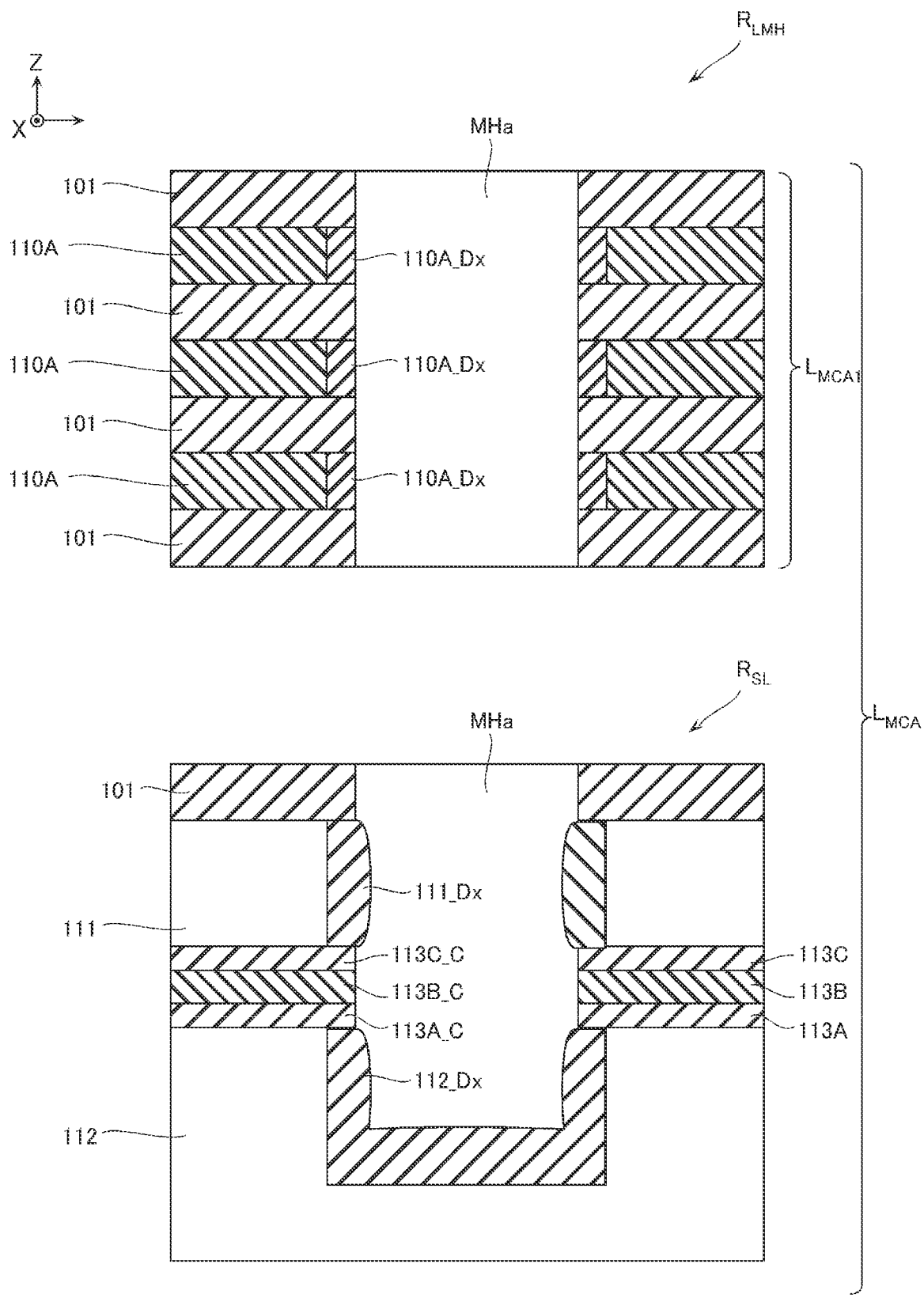
FIG. 31 is a schematic cross-sectional view illustrating a method for producing the semiconductor memory device according to a Comparative Example.
Figure 32:
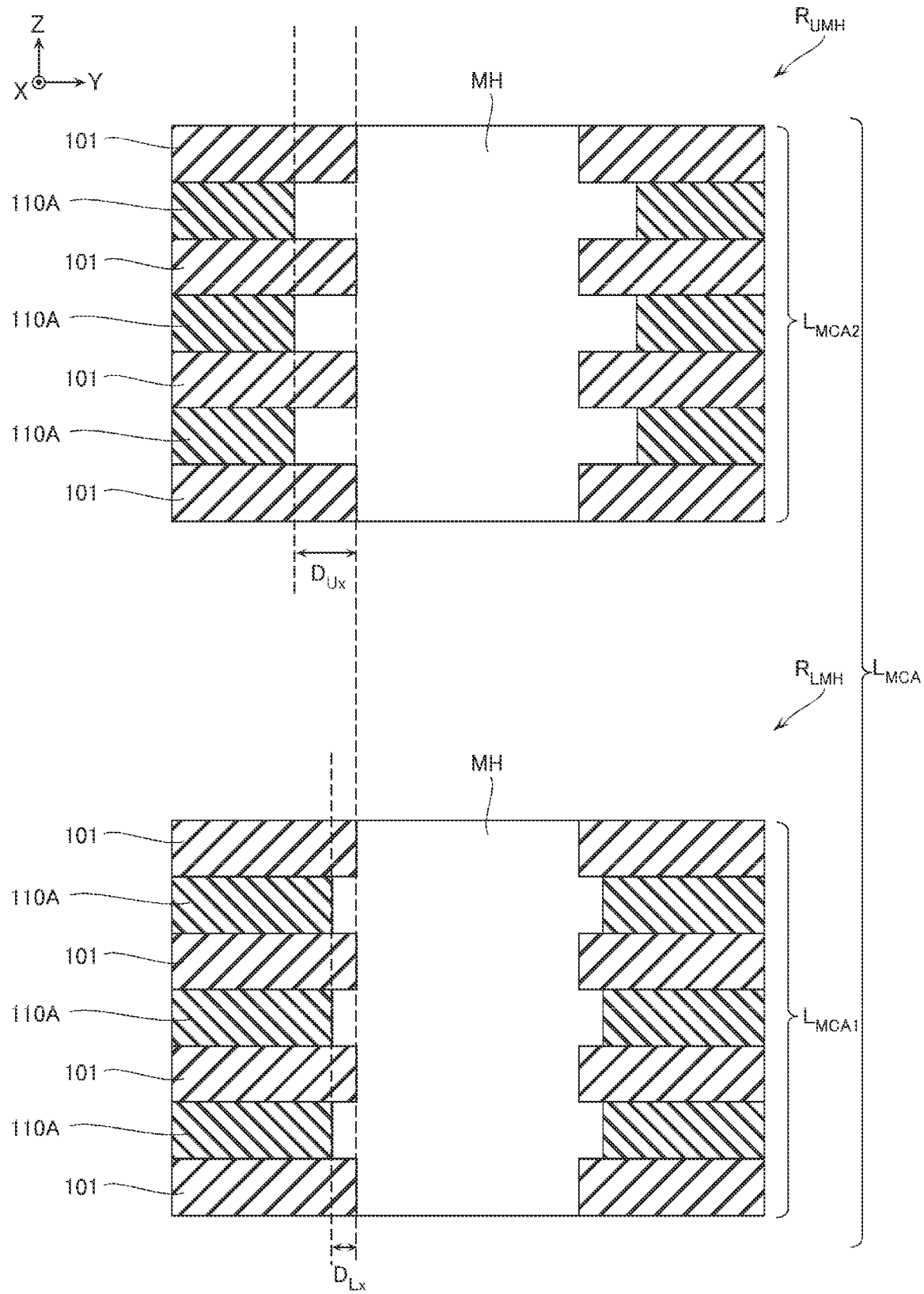
FIG. 32 is a schematic cross-sectional view illustrating the method for producing the semiconductor memory device according to a Comparative Example.

With reference to FIGS. 30 to 32, a semiconductor memory device according to Comparative Example will be described. FIG. is a schematic cross-sectional view illustrating the semiconductor memory device according to Comparative Example. FIGS. 31 and 32 are schematic cross-sectional views illustrating a method for producing the semiconductor memory device according to Comparative Example.

During production of the semiconductor memory device according to Comparative Example, the ion implantation process into the openings MHa that is described with reference to FIGS. 9 and 10 is not performed. Therefore, in the semiconductor memory device according to Comparative Example, the semiconductor layers 111 and 112 do not contain the regions 111_C and 112_C (FIG. 30), unlike the semiconductor memory device (FIG. 5) according to the first embodiment.

As illustrated in FIG. 31, during production of the semiconductor memory device according to Comparative Example, an insulating layer 111_Dx made of silicon oxide and the like is formed at a portion where the semiconductor layer 111 is exposed to each of the openings MHa, and an insulating layer 112_Dx made of silicon oxide and the like is formed at a portion where the semiconductor layer 112 is exposed to each of the openings MHa, in the oxidation process corresponding to FIGS. 11 and 12. During the formation of the insulating layers 111_Dx and 112_Dx, an oxidation reaction proceeds relatively slowly. This is because the semiconductor layers 111 and 112 do not contain a region where many crystal defects are generated such as the regions 111_C and 112_C. In a process corresponding to the process described with reference to FIG. 18, it takes a relatively long time to form the insulating layers 111_Dx and 112_Dx that have a thickness enough for an etching stopper.

Herein, in the process of forming the insulating layers 111_Dx and 112_Dx, portions where the sacrificial layers 110A are exposed to each of the openings MHa are also partially oxidized, to form insulating layers 110A_Dx made of silicon oxide and the like, as illustrated at the region $R_{LMH}$ of FIG. 31. During the production of the semiconductor memory device according to Comparative Example, it takes a relatively long time in the oxidation process corresponding to FIGS. 11 and 12, as described above. Therefore, the insulating layers 110A_Dx are formed to have a thickness larger than the thickness of the insulating layers 110A_D (FIG. 12) of the semiconductor memory device according to the first embodiment.

During the production of the semiconductor memory device according to Comparative Example, the insulating layers 110A_Dx (FIG. 31) are etched in the memory cell array layer $L_{MCA1}$ before etching of the sacrificial layers 110A in a process corresponding to FIG. 19. At that time, the thickness of the insulating layers 110A_Dx is relatively large, and therefore it takes a relatively long time to remove the insulating layers 110A_Dx. Accordingly, for this long time, etching of the sacrificial layers 110A in the memory cell array layer $L_{MCA2}$ further proceeds. In this process, a width $D_{UX}$ by which the sacrificial layers 110A in the memory cell array layer $L_{MCA2}$ are shifted backward is larger than a width $D_{LX}$ by which the sacrificial layers 110A in the memory cell array layer $L_{MCA1}$ are shifted backward, as illustrated in FIG. 32.

In this case, a structure of the memory cells MC that is a final structure in the memory cell array layer $L_{MCA1}$ is largely different from that in the memory cell array layer $L_{MCA2}$, and the properties of the memory cells MC may largely vary.

Effect of First Embodiment

As described with reference to FIGS. 9 and 10, the ion implantation process into the openings MHa is performed to form the regions 111_C and 112_C. Thus, the oxidation process described with reference to FIGS. 11 and 12 can proceed relatively fast. Accordingly, the insulating layers 110A_D on the side walls of the sacrificial layers 110A in the memory cell array layer $L_{MCA1}$ that are simultaneously formed in this process can be made relatively thin.

In the process of etching the sacrificial layers 110A described with reference to FIG. 19, the amount in which the sacrificial layers 110A in the memory cell array layer $L_{MCA1}$ are shifted backward can be made substantially the same as the amount in which the sacrificial layers 110A in the memory cell array layer $L_{MCA2}$ are shifted backward. Therefore, the memory cells MC that have uniform properties can be suitably produced.

Second Embodiment

Figure 33:
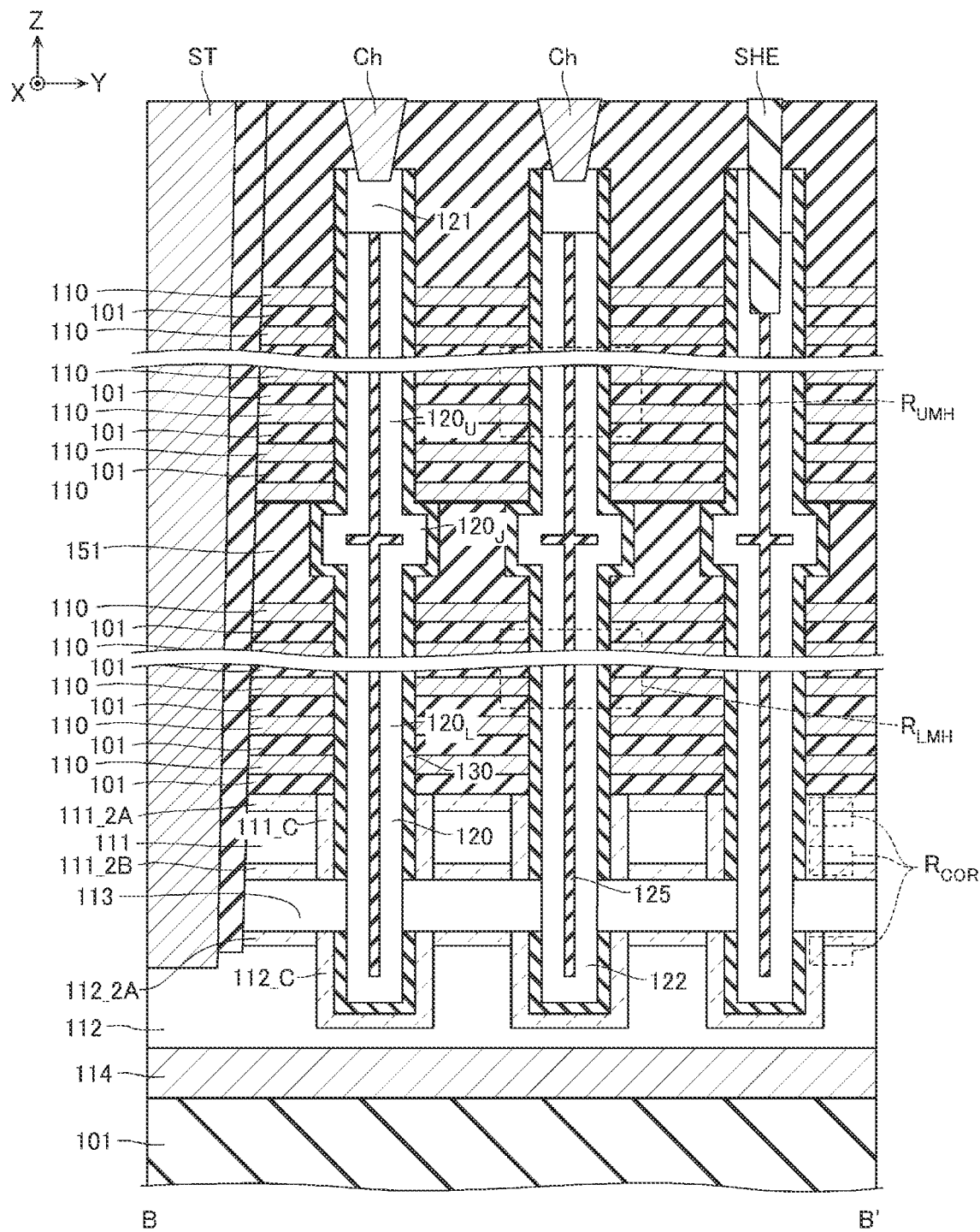
FIG. 33 is a schematic cross-sectional view illustrating a configuration of a part of a semiconductor memory device according to a second embodiment.

With reference to FIG. 33, a semiconductor memory device according to a second embodiment will be described. FIG. 33 is a schematic cross-sectional view illustrating the semiconductor memory device according to the second embodiment.

The semiconductor memory device according to the second embodiment has basically the same configuration as that of the semiconductor memory device according to the first embodiment. The semiconductor memory device according to the second embodiment includes semiconductor layers 111_2A and 111_2B as an upper layer and a lower layer, respectively, of the semiconductor layer 111, and a semiconductor layer 112_2A as an upper layer of the semiconductor layer 112. For example, the semiconductor layers 111_2A, 111_2B, and 112_2A contain at least one element of phosphorus (P), arsenic (As), carbon (C), and argon (Ar). The concentrations of the element in the semiconductor layers 111_2A, 111_2B, and 112_2A are larger than the concentrations of the element in regions other than the regions 111_C and 112_C in the semiconductor layers 111 and 112.

Production Method

Figure 34:
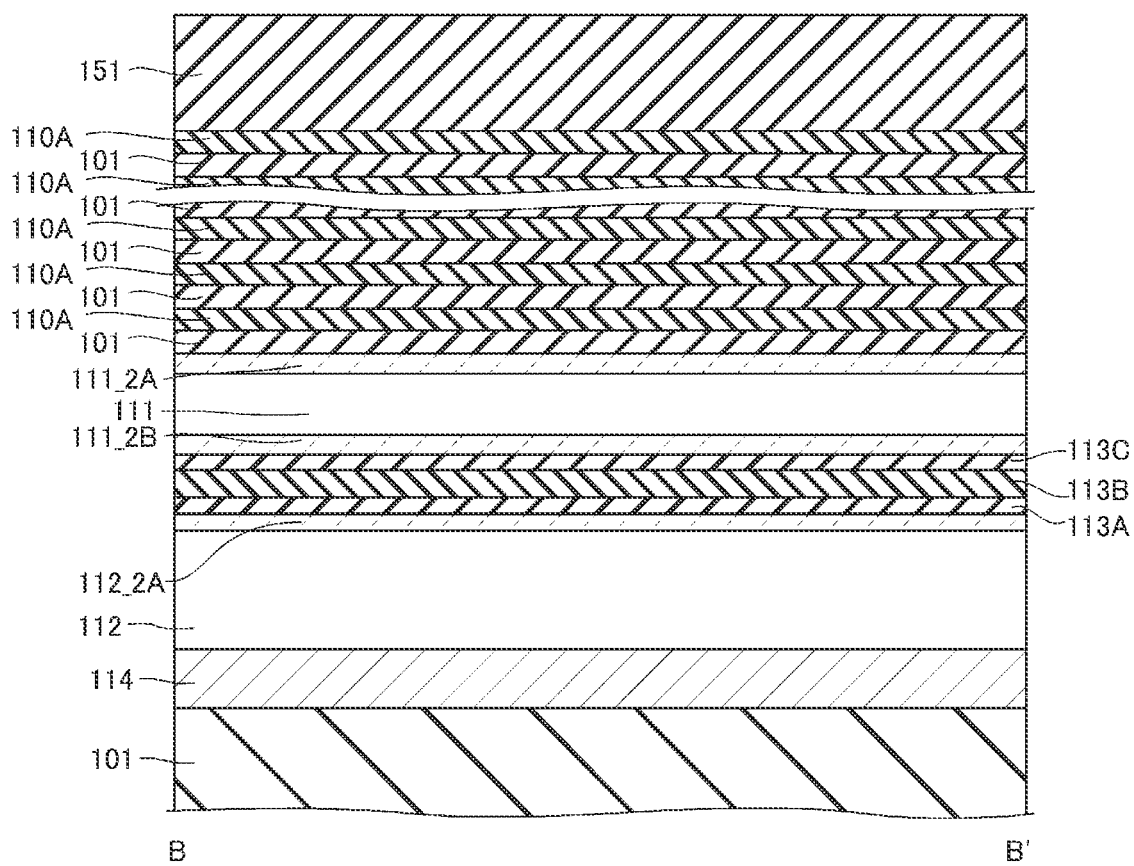
FIG. 34 is a schematic cross-sectional view illustrating a method for producing the semiconductor memory device.
Figure 35:
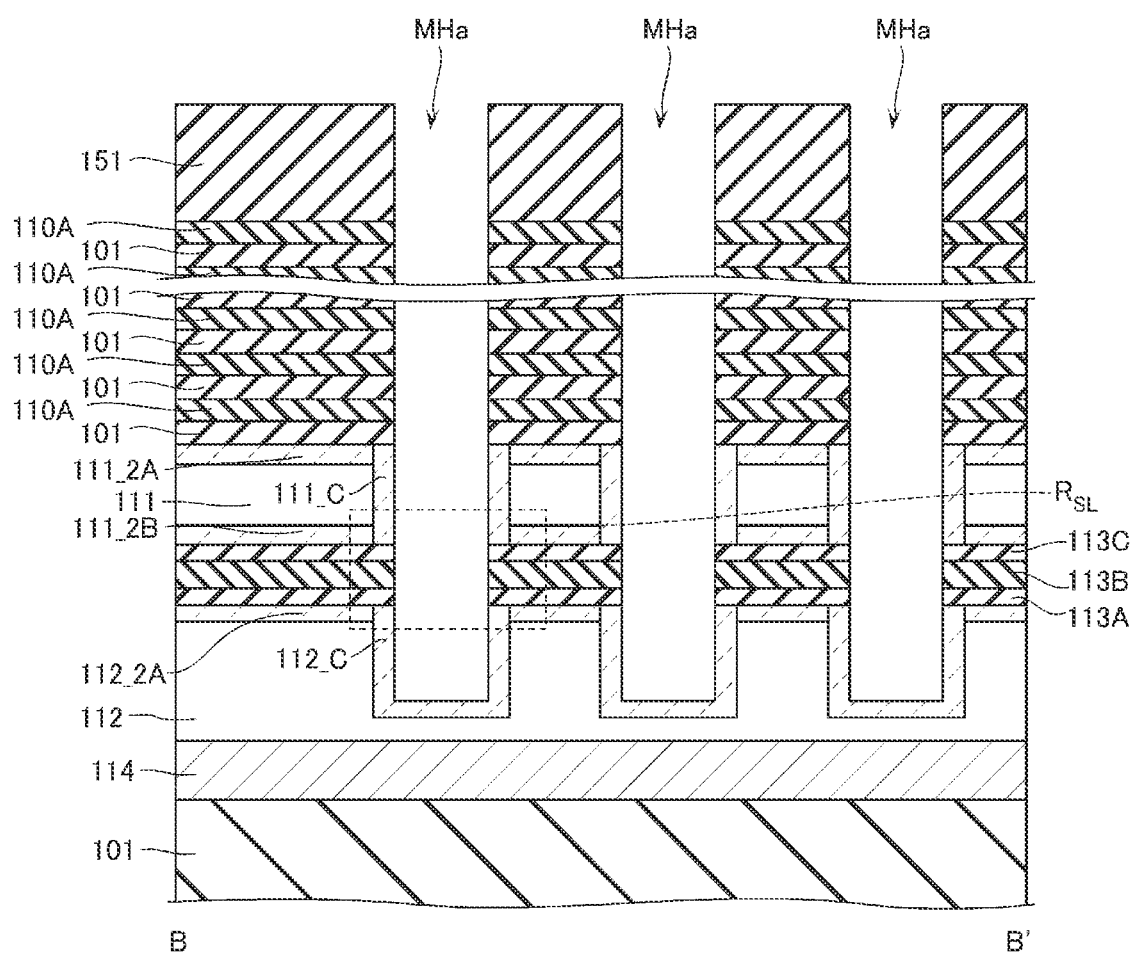
FIG. 35 is a schematic cross-sectional view illustrating the method for producing the semiconductor memory device.
Figure 36:
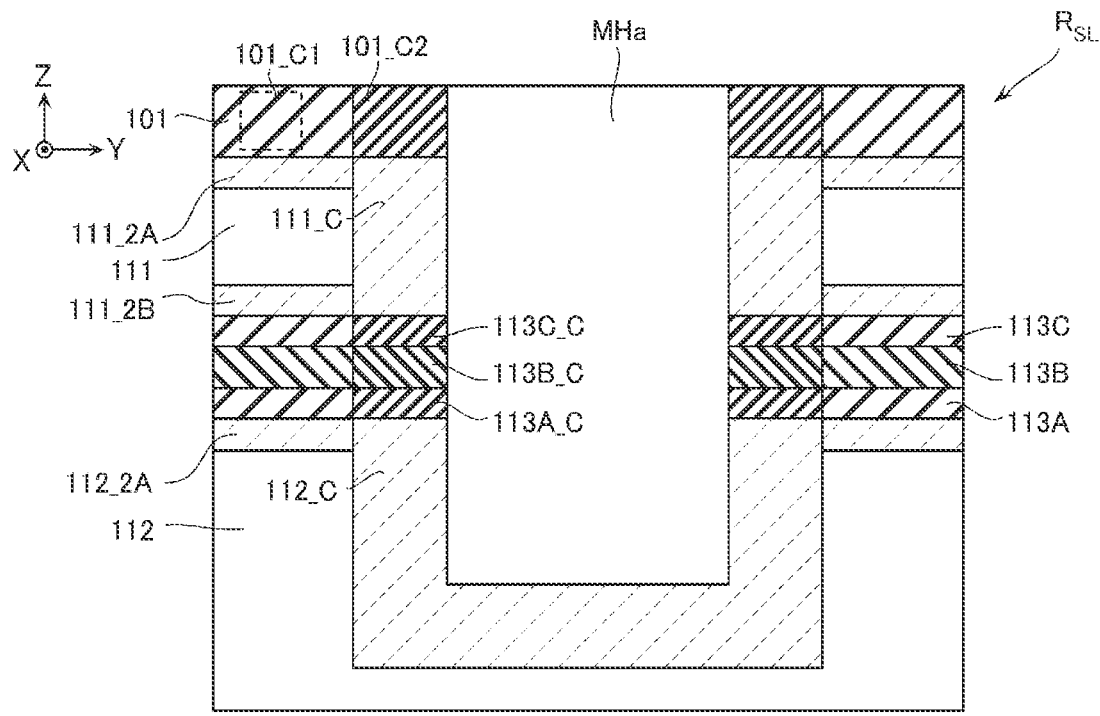
FIG. 36 is a schematic cross-sectional view illustrating the method for producing the semiconductor memory device.
Figure 37:
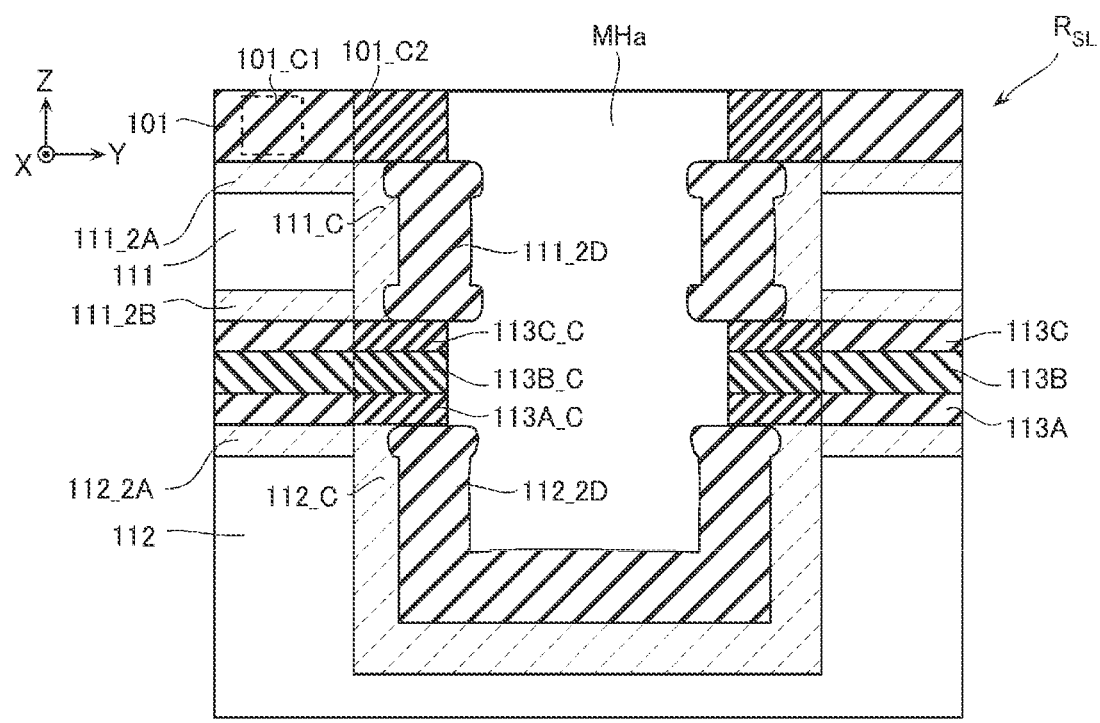
FIG. 37 is a schematic cross-sectional view illustrating the method for producing the semiconductor memory device.

With reference to FIGS. 34 to 37, a method for producing the semiconductor memory device according to the second embodiment will be described. FIGS. 34 and 35 are schematic cross-sectional views illustrating this method, and illustrate a cross section corresponding to FIG. 33. FIGS. 36 and 37 are schematic cross-sectional views illustrating this method. FIGS. 36 and 37 are views of the region $R_{SL}$ illustrated in FIG. 35 on an enlarged scale.

The semiconductor memory device according to the second embodiment is produced basically in the same manner as the method for producing the semiconductor memory device according to the first embodiment.

However, during production of the semiconductor memory device according to the second embodiment, the semiconductor layer 112_2A is formed as the upper layer of the semiconductor layer 112, and the semiconductor layers 111_2A and 111_2B are formed as the upper layer and the lower layer, respectively, of the semiconductor layer 111 in the process corresponding to FIG. 7, as illustrated in FIG. 34.

As illustrated in FIGS. 35 and 36, the regions 111_C and 112_C containing an impurity such as phosphorus (P), arsenic (As), carbon (C), and argon (Ar) are formed in the openings MHa in the ion implantation process corresponding to FIGS. 9 and 10. In this process, the upper surface, the lower surface, and the side face on an opening MHa side of the semiconductor layer 111 are surrounded by the semiconductor layers 111_2A and 111_2B, and the region 111_C that are a region containing at least one element of phosphorus (P), arsenic (As), carbon (C), and argon (Ar). The upper surface and the side face on the opening MHa side of the semiconductor layer 112 are also surrounded by the same semiconductor layer 112_2A and the same region 112_C.

As illustrated in FIG. 37, insulating layers 111_2D and 112_2D made of silicon oxide and the like are formed at portions (the regions 111_C and 112_C, respectively) where the semiconductor layers 111 and 112 are exposed to each of the openings MHa in the oxidation process corresponding to FIGS. 11 and 12.

As described above, oxidation proceeds relatively fast in the regions 111_C and 112_C that contain many crystal defects. Oxidation proceeds relatively fast also in a region where the impurity concentration is high like the semiconductor layers 111_2A, 111_2B, and 112_2A. Therefore, oxidation proceeds at positions closer to the semiconductor layers 111_2A, 111_2B, and 112_2A in a region ranging from the openings MHa to a region relatively far from the openings MHa.

Effect of Second Embodiment

It is known that the oxidation rate at a position corresponding to "corners" of semiconductor layers, like regions $R_{COR}$ illustrated in FIG. 33, is relatively low due to a stress generated by volumetric expansion during conversion of silicon to silicon oxide in the oxidation process. Therefore, a long time may be required for the oxidation process to form the insulating layers 111_2D and 112_2D that have a thickness enough to protect the "corners".

In this embodiment, the semiconductor layers 111_2A, 111_2B, and 112_2A that are a high-concentration impurity layer are provided at positions surrounding the "corners" of the semiconductor layers, in addition to the regions 111_C and 112_C formed by ion implantation. In a semiconductor layer containing an impurity at a high concentration, the oxidation rate is increased, like the regions 111_C and 112_C formed by the ion implantation process since such a semiconductor layer contains many crystal defects. When the "corners" are surrounded by the regions 111_C and 112_C and the semiconductor layers 111_2A, 111_2B, and 112_2A, the insulating layers 111_2D and 112_2D that have a predetermined thickness can be formed relatively fast even at the "corners" where an oxidation reaction proceeds relatively slowly.

Accordingly, the insulating layers 110A_D on the side walls of the sacrificial layers 110A in the memory cell array layer $L_{MCA1}$ that are simultaneously formed in this oxidation process can be made relatively thin, like the first embodiment. In the etching process in which the sacrificial layers 110A are shifted backward as described with reference to FIG. 19, the amount in which the sacrificial layers 110A in the memory cell array layer $L_{MCA1}$ are shifted backward can be made substantially the same as the amount in which the sacrificial layers 110A in the memory cell array layer $L_{MCA2}$ are shifted backward, and the memory cells MC that have uniform properties can be suitably produced.

Third Embodiment

Figure 38:
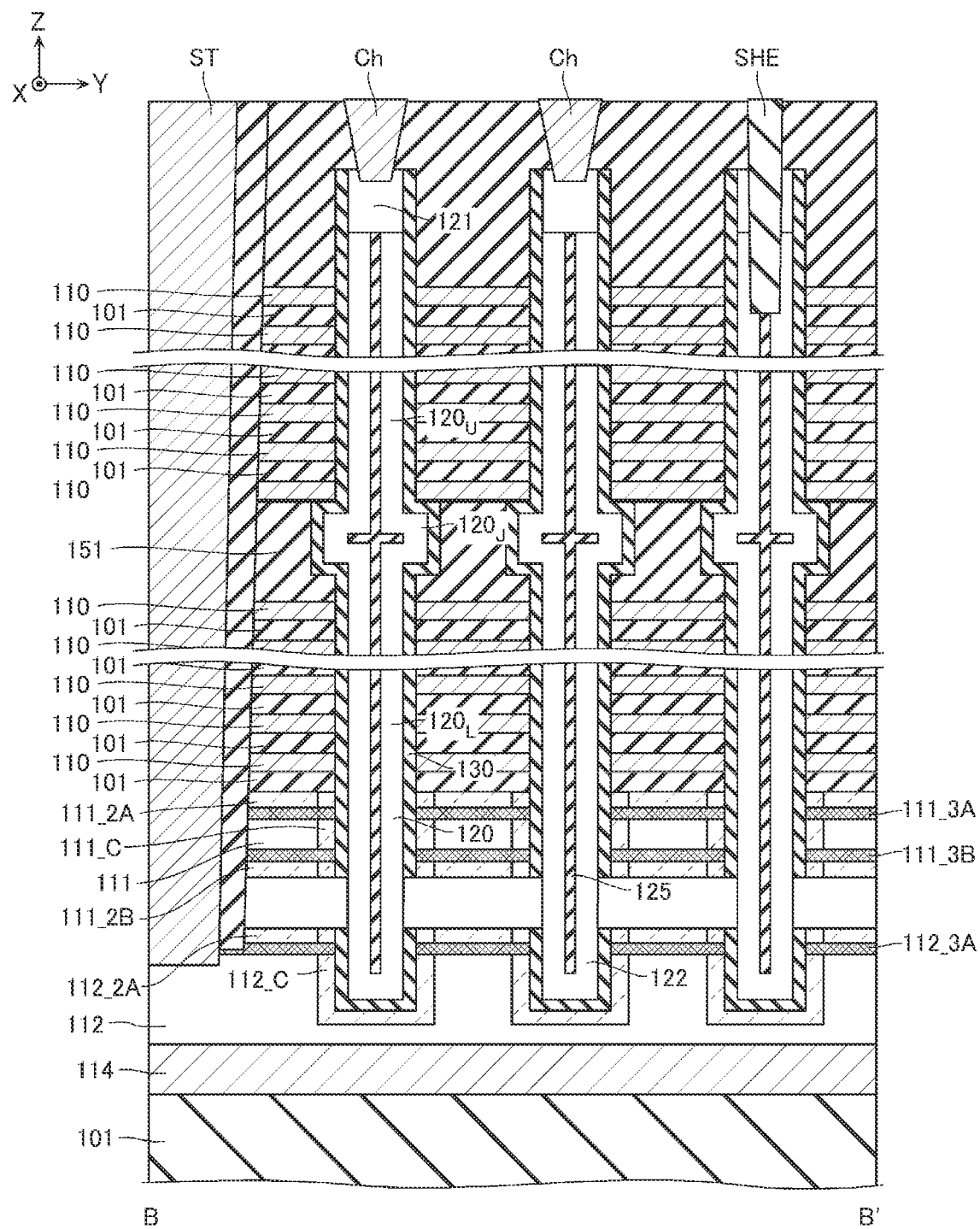
FIG. 38 is a schematic cross-sectional view illustrating a configuration of a part of a semiconductor memory device according to a third embodiment.

With reference to FIG. 38, a semiconductor memory device according to a third embodiment will be described. FIG. 38 is a schematic cross-sectional view illustrating the semiconductor memory device according to the third embodiment.

The semiconductor memory device according to the third embodiment has basically the same configuration as that of the semiconductor memory device according to the second embodiment. The semiconductor memory device according to the third embodiment includes a diffusion-suppressing layer 111_3A as a lower layer of the semiconductor layer 111_2A, a diffusion-suppressing layer 111_3B as an upper layer of the semiconductor layer 111_2B, and a diffusion-suppressing layer 112_3A as a lower layer of the semiconductor layer 112_2A. For example, the diffusion-suppressing layers 111_3A, 111_3B, and 112_3A are a layer including carbon (C), a semiconductor layer containing carbon at a high concentration, or the like. The concentrations of carbon in the diffusion-suppressing layers 111_3A, 111_3B, and 112_3A are lager than the concentrations of carbon in the semiconductor layers 111 and 112.

Production Method

Figure 39:
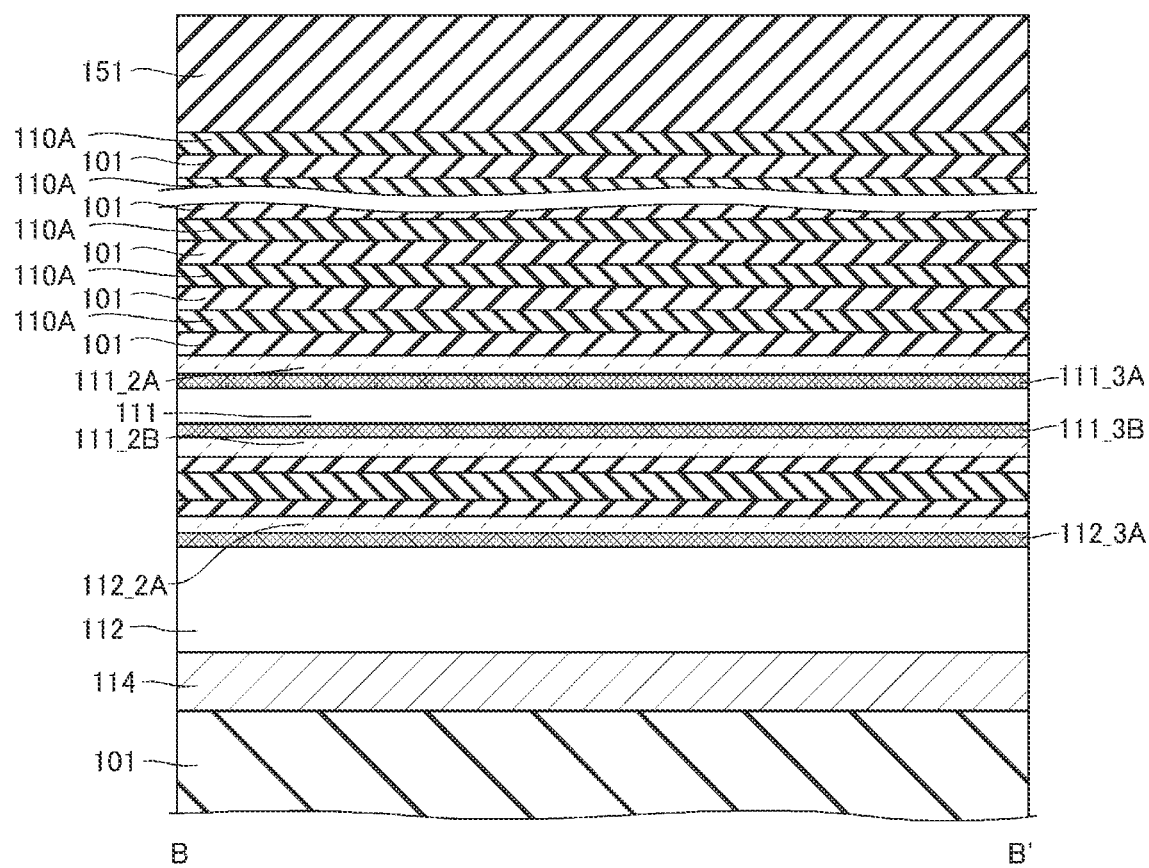
FIG. 39 is a schematic cross-sectional view illustrating a method for producing the semiconductor memory device.

With reference to FIG. 39, a method for producing the semiconductor memory device according to the third embodiment will be described. FIG. 39 is a schematic cross-sectional view illustrating this method, and illustrates a cross section corresponding to FIG. 38.

The semiconductor memory device according to the third embodiment is produced basically in the same manner as the method for producing the semiconductor memory device according to the second embodiment. However, during production of the semiconductor memory device according to the third embodiment, the diffusion-suppressing layer 112_3A is formed as the lower layer of the semiconductor layer 112_2A, the diffusion-suppressing layer 111_3B is formed as the upper layer of the semiconductor layer 111_2B, and the diffusion-suppressing layer 111_3A is formed as the lower layer of the semiconductor layer 111_2A in the process corresponding to FIG. 34, as illustrated in FIG. 39.

Effect of Third Embodiment

When the semiconductor layers 111_2A, 111_2B, and 112_2A contain, for example, at least one element of phosphorus (P), arsenic (As), carbon (C), and argon (Ar) at a high concentration, the element may be diffused in the semiconductor layers 111 and 112 by various types of thermal steps in the production process, and the effect of improving the oxidation rate as described in the second embodiment may be deteriorated.

Therefore, when the diffusion-suppressing layers 111_3A, 111_3B, and 112_3A are disposed as the upper surface or the lower surface of the semiconductor layers 111_2A, 111_2B, and 112_2A, like this embodiment, diffusion of an impurity from the semiconductor layers 111_2A, 111_2B, and 112_2A in the semiconductor layers 111 and 112 can be suppressed.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a substrate;
   a plurality of first conductive layers and a plurality of first insulating layers alternately arranged in a first direction, the first direction intersecting the substrate;
   a first semiconductor layer extending in the first direction, the first semiconductor layer facing the first conductive layers and the first insulating layers;
   a charge storage layer disposed between the first conductive layers and the first semiconductor layer; and
   a second semiconductor layer connected to one end of the first semiconductor layer in the first direction, wherein
   the second semiconductor layer contains a first element,
   the first element is at least one of phosphorus (P), arsenic (As), carbon (C), or argon (Ar),
   the second semiconductor layer including:
      a fourth region,
      a fifth region disposed between the fourth region and the charge storage layer,
      a sixth region disposed above the fourth region,
      a seventh region disposed between the sixth region and the charge storage layer, and
      an eighth region disposed between the fifth region and the seventh region, and directly contacting the first semiconductor layer,
   wherein a concentration of the first element in the fifth region is larger than a concentration of the first element in the fourth region, and a concentration of the first element in seventh region is larger than a concentration of the first element in the sixth region and fourth region.

2. The semiconductor memory device according to claim 1, wherein the first element is carbon (C), comprising:
   a ninth region disposed below the eighth region, and
   a tenth region disposed above the eighth region,
   wherein a concentration of carbon (C) in the ninth region is larger than a concentration of carbon in the sixth region and the fourth region, and a concentration of carbon in the tenth region is larger than a concentration of carbon in the sixth region and the fourth region.

3. The semiconductor memory device according to claim 1, wherein the first conductive layers include a stacked film.

4. The semiconductor memory device according to claim 3, wherein the stacked film includes a barrier conductive film.

5. The semiconductor memory device according to claim 4, wherein the stacked film includes a metal film.

6. The semiconductor memory device according to claim 3, wherein the stacked film includes a doped polycrystalline silicon film.

7. The semiconductor memory device according to claim 1, wherein the first insulating layers include silicon oxide.

8. The semiconductor memory device according to claim 1, wherein the semiconductor memory device is at least one of a memory die, a memory system including a controller die, a memory card, or a solid state drive (SSD).

9. The semiconductor memory device according to claim 1, wherein the first semiconductor layer includes polycrystalline silicon.

10. The semiconductor memory device according to claim 1, wherein the first semiconductor layer is substantially cylindrical in shape.

11. The semiconductor memory device according to claim 1, wherein the first charge storage layer is substantially cylindrical in shape.

12. The semiconductor memory device according to claim 1, wherein the first charge storage layer includes polycrystalline silicon.

* * * * *